(12) United States Patent
Hsu

(10) Patent No.: US 9,086,532 B2
(45) Date of Patent: *Jul. 21, 2015

(54) BLUE PHOTOSENSITIVE RESIN COMPOSITION FOR COLOR FILTER AND USES THEREOF

(71) Applicant: CHI MEI CORPORATION, Tainan (TW)

(72) Inventor: Jung-Pin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/444,265

(22) Filed: Jul. 28, 2014

(65) Prior Publication Data

US 2015/0042931 A1 Feb. 12, 2015

(30) Foreign Application Priority Data

Aug. 9, 2013 (TW) .............................. 102128565 A

(51) Int. Cl.

| G02B 5/20 | (2006.01) |
| G02F 1/1335 | (2006.01) |
| G03F 7/038 | (2006.01) |
| G02B 1/10 | (2015.01) |
| G03F 7/00 | (2006.01) |
| G02B 1/04 | (2006.01) |
| G02B 5/22 | (2006.01) |

(52) U.S. Cl.
CPC .. G02B 1/10 (2013.01); G02B 1/04 (2013.01); G02B 5/223 (2013.01); G02F 1/133514 (2013.01); G02F 1/133516 (2013.01); G03F 7/0007 (2013.01)

(58) Field of Classification Search
CPC .. G03F 7/0007; G02B 5/223; G02F 1/133516
USPC ........................................ 430/7, 270.1, 287.1
See application file for complete search history.

(56) References Cited

FOREIGN PATENT DOCUMENTS

| JP | H09-095638 | 4/1997 |
| JP | H09-197663 | 7/1997 |
| JP | 2005-055814 A | * 3/2005 |
| JP | 2006-079012 | 3/2006 |
| JP | 2012-212005 A | * 11/2012 |
| TW | 2007-05099 A | 2/2007 |
| TW | 2010-22379 A1 | 6/2010 |

OTHER PUBLICATIONS

Computer-generated transaltion of JP 2005-055814 (Mar. 2005).*
Computer-generated translation of JP 2012-212005 (Nov. 2012).*
Office action and Search Report issued on Dec. 22 for the corresponding Taiwan, R.O.C. Patent Application No. 102128565.
English translation of the Search Report issued on Dec. 22 for the corresponding Taiwan, R.O.C. Patent Application No. 102128565.
English Abstract translation of TW 2010-22379A1.
English Abstract translation of TW 2007-05099A.

\* cited by examiner

Primary Examiner — John A McPherson
(74) Attorney, Agent, or Firm — WPAT, P.C.; Anthony King

(57) ABSTRACT

The invention relates to a blue photosensitive resin composition that has the advantages of good developing-resistance, good ageing stability of sensitivity and good contrast. The invention also provides a method for manufacturing a color filter, a color filter and a liquid crystal display device.

17 Claims, 1 Drawing Sheet

BLUE PHOTOSENSITIVE RESIN COMPOSITION FOR COLOR FILTER AND USES THEREOF

BACKGROUND OF THE INVENTION

1. Field of the Invention

The invention relates to a blue photosensitive resin composition for a color filter in a liquid crystal display device, and a color filter and liquid crystal display device formed by the aforementioned blue photosensitive resin composition. More particularly, the invention provides a blue photosensitive resin composition for a color filter having good developing-resistance, good ageing stability of sensitivity and good contrast.

2. Description of the Related Art

With advancing technology and broadening applications, large-sized liquid crystal display devices with high color reproduction, such as liquid crystal display televisions, are being actively developed. Generally, NTSC color reproduction of desktop liquid crystal display devices ranges roughly from 50 percent to 60 percent while NTSC color reproduction of the liquid crystal television ranges roughly from 60 percent to 75 percent. Therefore, mere application of the components for the desktop liquid crystal display device, such as a liquid crystal display element and a backlight unit (for example, cold cathode fluorescent lamp (CCFL)), to the liquid crystal display television is not able to satisfy the color reproduction requirement for the liquid crystal display television.

When the backlight unit of the desktop liquid crystal display is used for the liquid crystal display television, a color filter must have a thicker blue filter segment or a denser blue pigment to satisfy the requirement of the color reproduction for the liquid crystal display television, which, however, may lead to drastic decrease in light permeability of the blue color filter segment.

JP-H09-095638 discloses a blue photosensitive resin composition for forming a color filter which comprises an alpha-copper phthalocyanine blue pigment, an epsilon-copper phthalocyanine blue pigment, a photosensitive resin, a photoinitiator, and a solvent. Furthermore, JP-H09-197663 also discloses a blue photosensitive resin composition for forming a color filter which comprises a copper phthalocyanine blue pigment, an indanthrone blue pigment, a photosensitive resin, a photoinitiator, and a solvent. These two blue photosensitive resin compositions can solve the abovementioned light permeability issues.

The blue photosensitive resin compositions disclosed in the above-mentioned patents both use different blue pigments to improve the light permeability. However, the increase of the concentration of the pigments would lead to the decrease of the contrast of the color filter comprising the blue photosensitive resin compositions because light scattering occurring due to the particle diameter of the pigments. Therefore, Japanese Patent Publication No. 2006-079012 discloses a pyrazole squarylium dye that only absorbs light to present color and a blue pigment 15:6 to increase the contrast of the color filter. However, the ageing stability of sensitivity and developing-resistance are both not satisfactory.

Furthermore, in order to meet the modern requirement of color saturation, the concentration of the pigment must be raised and a high-dose photoinitiator must be incorporated. However, when mixing the high-concentration pigment and a common photoinitiator, the ageing stability of sensitivity is poor. In addition, using the high-concentration pigment, the ratio of the pigment of the photosensitive resin composition is also high and the used amounts of an alkali-soluble resin and photosensitive monomer decrease. Such phenomenon leads the decrease of the degree of cross-linking after exposure and poor develop-resistance.

Therefore, improving developing-resistance, ageing stability of sensitivity and contrast of the liquid crystal display device to meet the modern requirements is a target remained to be achieved in the technical field of the present invention.

SUMMARY OF THE INVENTION

In the present invention, a specific organic pigment, alkali-soluble resin, cationic polymeric compound and cationic photoinitiator are provided to obtain a blue photosensitive resin composition for a color filter having good developing-resistance, good ageing stability of sensitivity and good contrast.

Therefore, the invention relates to a blue photosensitive resin composition for a color filter comprising:

an organic pigment (A);
a dye (B);
an alkali-soluble resin (C);
a cationic polymeric compound (D);
a cationic photoinitiator (E); and
an organic solvent (F);
wherein:
the dye (B) comprises a red dye represented by Formula (I):

Formula (I)

$$\text{[Structure: xanthene-based dye with } R^1R^2N \text{ and } R^3R^4N^+ \text{ groups on a xanthene core, phenyl substituent with } (R^5)_m \text{, counterion } (X^\ominus)_a \text{]}$$

in Formula (I):

$R^1$, $R^2$, $R^3$, and $R^4$ are independently selected from the group consisting of hydrogen, $-R^6$, and a $C_6$-$C_{10}$ aryl group unsubstituted or substituted with a substituent selected from the group consisting of a halogen atom, $-R^6$, $-OH$, $-OR^6$, $-SO_3^-$, $-SO_3H$, $-SO_3M$, $-COOH$, $-COOR^6$, $-SO_3R^6$, $-SO_2NHR^8$, and $-SO_2NR^8R^9$;

$R^5$ is selected from the group consisting of $-SO_3^-$, $-SO_3H$, $-SO_3M$, $-COOH$, $-COOR^6$, $-SO_3R^6$, $-SO_2NHR^8$, and $-SO_2NR^8R^9$;

m is an integer ranging from 0 to 5; when m is from 2 to 5, a plurality of $R^5$ is the same or different;

X represents a halogen atom;

a is 0 or 1;

$R^6$ is a $C_1$-$C_{10}$ alkyl group unsubstituted or substituted with a halogen atom; wherein $-CH_2-$ contained in said $C_1$-$C_{10}$ alkyl group is un-replaced or replaced with $-O-$, carbonyl, or $-NR^7-$;

$R^7$ is a $C_1$-$C_{10}$ alkyl group unsubstituted or substituted with a halogen atom;

$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein a hydrogen atom in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —OH, a halogen atom, -Q, —CH=$CH_2$, and —CH=CH—$R^6$; and a —$CH_2$— in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —O—, carbonyl, and —$NR^7$—; or $R^8$ and $R^9$ join together to form a $C_1$-$C_{10}$ heterocyclic group; wherein a hydrogen atom in the $C_1$-$C_{10}$ heterocyclic group is unsubstituted or substituted with a substituent selected from the group consisting of $R^6$, —OH and -Q;

Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of a halogen atom, —$R^6$, —OH, —$OR^6$, —$NO_2$, —CH=$CH_2$, and —CH=CH—$R^6$, and a $C_5$-$C_{10}$ heteroaryl group substituted with a substituent selected from the group consisting of halogen, —$R^6$, —OH, —$OR^6$, —$NO_2$, —CH=$CH_2$, and —CH=CH—$R^6$; and M represents potassium or sodium; and the alkali-soluble resin (C) comprises a first alkali-soluble resin (C-1), and the first alkali-soluble resin (C-1) is obtained by polymerizing a mixture comprising an epoxy compound (i) containing at least two epoxy groups, and a compound (ii) containing at least one carboxylic acid group and at least one ethylenically unsaturated group.

The present invention also provides a method for manufacturing a color filter, which forms a pixel layer by the blue photosensitive resin composition as mentioned above.

The present invention also provides a color filter, which is manufactured by the method as mentioned above.

The present invention further provides a liquid crystal display device comprising the color filter as mentioned above.

DETAILED DESCRIPTION OF THE INVENTION

Figure 1:
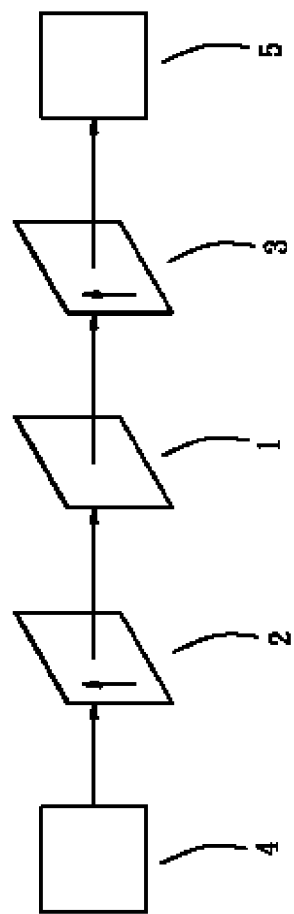
FIG. 1 is a schematic view depicting a contrast measurement state (1) of the photosensitive resin layer.

The invention relates to a blue photosensitive resin composition for a color filter comprising:

an organic pigment (A);

a dye (B);

an alkali-soluble resin (C);

a cationic polymeric compound (D);

a cationic photoinitiator (E); and an organic solvent (F);

wherein:

the dye (B) comprises a red dye represented by Formula (I):

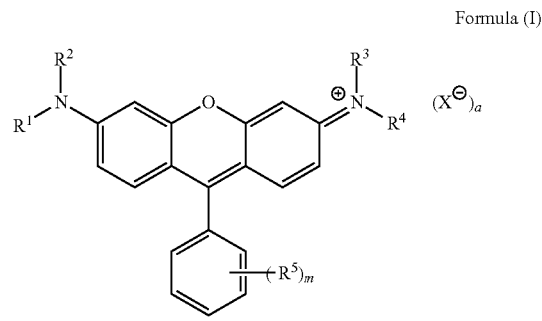

Formula (I)

in Formula (I):

$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of a halogen atom, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;

$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;

m is an integer ranging from 0 to 5; when m is from 2 to 5, a plurality of $R^5$ is the same or different;

X represents a halogen atom;

a is 0 or 1;

$R^6$ is a $C_1$-$C_{10}$ alkyl group unsubstituted or substituted with a halogen atom; wherein —$CH_2$— contained in said $C_1$-$C_{10}$ alkyl group is un-replaced or replaced with —O—, carbonyl, or —$NR^7$—;

$R^7$ is a $C_1$-$C_{10}$ alkyl group unsubstituted or substituted with a halogen atom;

$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein a hydrogen atom in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —OH, a halogen atom, -Q, —CH=$CH_2$, and —CH=CH—$R^6$; and a —$CH_2$— in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —O—, carbonyl, and —$NR^7$—; or $R^8$ and $R^9$ join together to form a $C_1$-$C_{10}$ heterocyclic group; wherein a hydrogen atom in the $C_1$-$C_{10}$ heterocyclic group is unsubstituted or substituted with a substituent selected from the group consisting of $R^6$, —OH and -Q;

Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of a halogen atom, —$R^6$, —OH, —$OR^6$, —$NO_2$, —CH=$CH_2$, and —CH=CH—$R^6$, and a $C_5$-$C_{10}$ heteroaryl group substituted with a substituent selected from the group consisting of halogen, —$R^6$, —OH, —$OR^6$, —$NO_2$, —CH=$CH_2$, and —CH=CH—$R^6$; and M represents potassium or sodium; and the alkali-soluble resin (C) comprises a first alkali-soluble resin (C-1), and the first alkali-soluble resin (C-1) is obtained by polymerizing a mixture comprising an epoxy compound (i) containing at least two epoxy groups, and a compound (ii) containing at least one carboxylic acid group and at least one ethylenically unsaturated group.

The organic pigment (A) according to the present invention provides a blue pigment.

In one embodiment of the present invention, based on 100 parts by weight of the total used amount of the alkali-soluble resin (C), the used amount of the organic pigment (A) is 30 parts by weight to 300 parts by weight; preferably 40 parts by weight to 250 parts by weight; more preferably 50 parts by weight to 200 parts by weight.

Preferably, the organic pigment (A) comprises a copper phthalocyanine-based blue pigment (A-1). Examples of the copper phthalocyanine-based blue pigment (A-1) can be used alone or in admixture of two or more thereof, and include but are not limited to, C.I. Pigment Blue 15:1, C.I. Pigment Blue 15:2, C.I. Pigment Blue 15:3, C.I. Pigment Blue 15:4, C.I. Pigment Blue 15:5, or C.I. Pigment Blue 15:6.

In one embodiment of the present invention, based on 100 parts by weight of the total used amount of the alkali-soluble resin (C), the used amount of the copper phthalocyanine-based blue pigment (A-1) is 20 parts by weight to 200 parts by weight; preferably 30 parts by weight to 180 parts by weight; more preferably 40 parts by weight to 160 parts by weight.

When the organic pigment (A) comprises the copper phthalocyanine-based blue pigment (A-1), the color reproduction is improved.

Preferably, the organic pigment (A) further comprises a violet pigment (A-2). Examples of the violet pigment (A-2) can be used alone or in admixture of two or more thereof, and include but are not limited to, C.I. Pigment Violet 14, C.I. Pigment Violet 19, C.I. Pigment Violet 23, C.I. Pigment Violet 29, C.I. Pigment Violet 32, C.I. Pigment Violet 33, C.I. Pigment Violet 36, C.I. Pigment Violet 37, C.I. Pigment Violet 38, C.I. Pigment Violet 40, or C.I. Pigment Violet 50.

In one embodiment of the present invention, based on 100 parts by weight of the total used amount of the alkali-soluble resin (C), the used amount of the violet pigment (A-2) is 10 parts by weight to 100 parts by weight; preferably 10 parts by weight to 70 parts by weight; more preferably 10 parts by weight to 40 parts by weight.

When the organic pigment (A) further comprises the violet pigment (A-2), the color reproduction is more improved.

The organic pigment (A) may further comprise a blue pigment (A-3) besides (A-1).

Examples of the blue pigment (A-3) include but are not limited to, C.I. Pigment Blue 1, C.I. Pigment Blue 21, C.I. Pigment Blue 22, C.I. Pigment Blue 60, C.I. Pigment Blue 61, C.I. Pigment Blue 64, or combinations thereof, and can be used alone or in admixture of two or more thereof.

In another embodiment of the invention, the organic pigment (A) further comprises a halogenated-phthalocyanine-based green pigment so as to adjust the chromaticity.

Preferably, examples of the halogenated-phthalocyanine-based green pigment can be used alone or in admixture of two or more thereof, and include but are not limited to C.I. Pigment Green 07, C.I. Pigment Green 36, C.I. Pigment Green 37, C.I. Pigment Green 42, and C.I. Pigment Green 58. More preferably, the halogenated-phthalocyanine-based green pigment is C.I. Pigment Green 07, C.I. Pigment Green 36, C.I. Pigment Green 37, C.I. Pigment Green 42, C.I. Pigment Green 58, or combinations thereof.

The dye (B) is beneficial for improving the brightness and adjusting the chromaticity of the blue photosensitive resin composition.

Preferably, the dye (B) comprises a red dye represented by Formula (I):

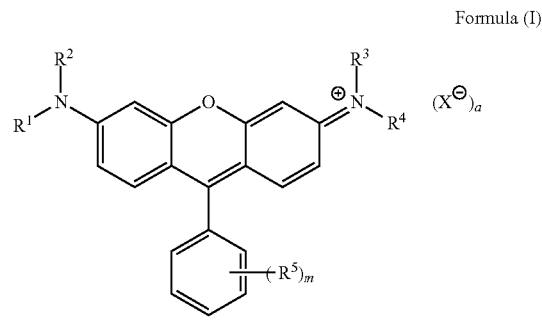

Formula (I)

in Formula (I):

$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of a halogen atom, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;

$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;

m is an integer ranging from 0 to 5; when m is from 2 to 5, a plurality of $R^5$ is the same or different;

X represents a halogen atom;

a is 0 or 1;

$R^6$ is a $C_1$-$C_{10}$ alkyl group unsubstituted or substituted with a halogen atom; wherein —$CH_2$— contained in said $C_1$-$C_{10}$ alkyl group is un-replaced or replaced with —O—, carbonyl, or —$NR^7$—;

$R^7$ is a $C_1$-$C_{10}$ alkyl group unsubstituted or substituted with a halogen atom;

$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein a hydrogen atom in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —OH, a halogen atom, -Q, —$CH=CH_2$, and —$CH=CH$—$R^6$; and a —$CH_2$— in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —O—, carbonyl, and —$NR^7$—; or $R^8$ and $R^9$ join together to form a $C_1$-$C_{10}$ heterocyclic group; wherein a hydrogen atom in the $C_1$-$C_{10}$ heterocyclic group is unsubstituted or substituted with a substituent selected from the group consisting of $R^6$, —OH and -Q;

Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of a halogen atom, —$R^6$, —OH, —$OR^6$, —$NO_2$, —$CH=CH_2$, and —$CH=CH$—$R^6$, and a $C_5$-$C_{10}$ heteroaryl group substituted with a substituent selected from the group consisting of halogen, —R⁶, —OH, —OR⁶, —NO₂, —CH═CH₂, and —CH═CH—R⁶; and M represents potassium or sodium.

Preferably, examples of $R^6$ include but are not limited to, methyl, ethyl, propyl, isopropyl, butyl, isobutyl, pentyl, isopentyl, neopentyl, cyclopentyl, hexyl, cyclohexyl, heptyl, cycloheptyl, octyl, cyclooctyl, 2-ethylhexyl, nonyl, decyl, tricycle(5.3.0.03,10)decanyl, methoxypropyl, hexyloxypropyl, 2-ethylhexyloxypropyl, methoxyhexyl, and epoxypropyl.

Preferably, examples of $C_6$-$C_{10}$ aryl group include but are not limited to, phenyl and naphthyl.

Preferably, examples of —SO₃R⁶ include but are not limited to, methanesulfonyl, ethanesulfonyl, hexanesulfonyl, and decanesulfonyl.

Preferably, examples of —COOR⁶ include but are not limited to, methoxycarbonyl, ethoxycarbonyl, propoxycarbonyl, iso-propoxycarbonyl, butoxycarbonyl, iso-butoxycarbonyl, pentoxycarbonyl, iso-pentoxycarbonyl, neo-pentoxycarbonyl, cyclopentoxycarbonyl, hexoxycarbonyl, cyclohexoxycarbonyl, heptoxycarbonyl, cycloheptoxycarbonyl, octoxycarbonyl, cyclooctoxycarbonyl, 2-ethylhexoxyc arbonyl, nonoxycarbonyl, decoxycarbonyl, tricycle(5.0.3.0.03,10)decylcarbonyl, methoxypropoxycarbonyl, hexoxypropoxycarbonyl, 2-ethylhexoxypropoxycarbonyl, and methoxyhexoxycarbonyl.

Preferably, examples of —SO₂NHR⁸ include but are not limited to, sulfamoyl, methylsulfamoyl, ethylsulfamoyl, propylsulfamoyl, iso-propylsulfamoyl, butylsulfamoyl, iso-butylsulfamoyl, pentylsulfamoyl, iso-pentylsulfamoyl, neo-pentylsulfamoyl, cyclopentylsulfamoyl, hexylsulfamoyl, cyclohexylsulfamoyl, heptylsulfamoyl, cycloheptylsulfamoyl, octylsulfamoyl, cyclooctylsulfamoyl, 2-ethylhexylsulfamoyl, nonylsulfamoyl, decylsulfamoyl, tricycle(5.0.3.0.03,10)decylsulfamoyl, methoxypropylsulfamoyl, hexoxypropylsulfamoyl, 2-ethylhexoxypropylsulfamoyl, methoxyhexylsulfamoyl, epoxypropylsulfamoyl, 1,5-dimethylhexylsulfamoyl, propoxypropylsulfamoyl, iso-propoxypropylsulfamoyl, 3-phenyl-1-methylpropylsulfamoyl,

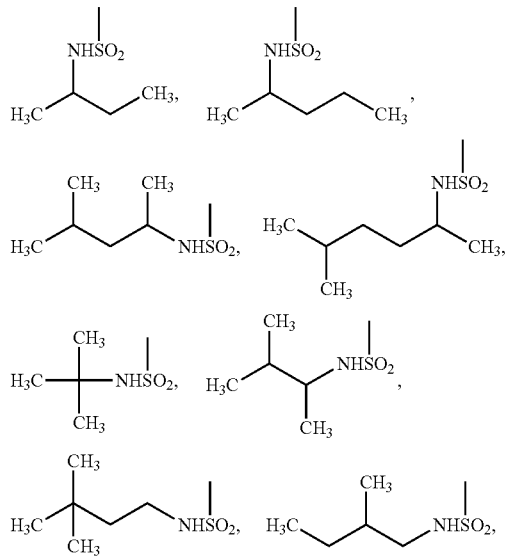

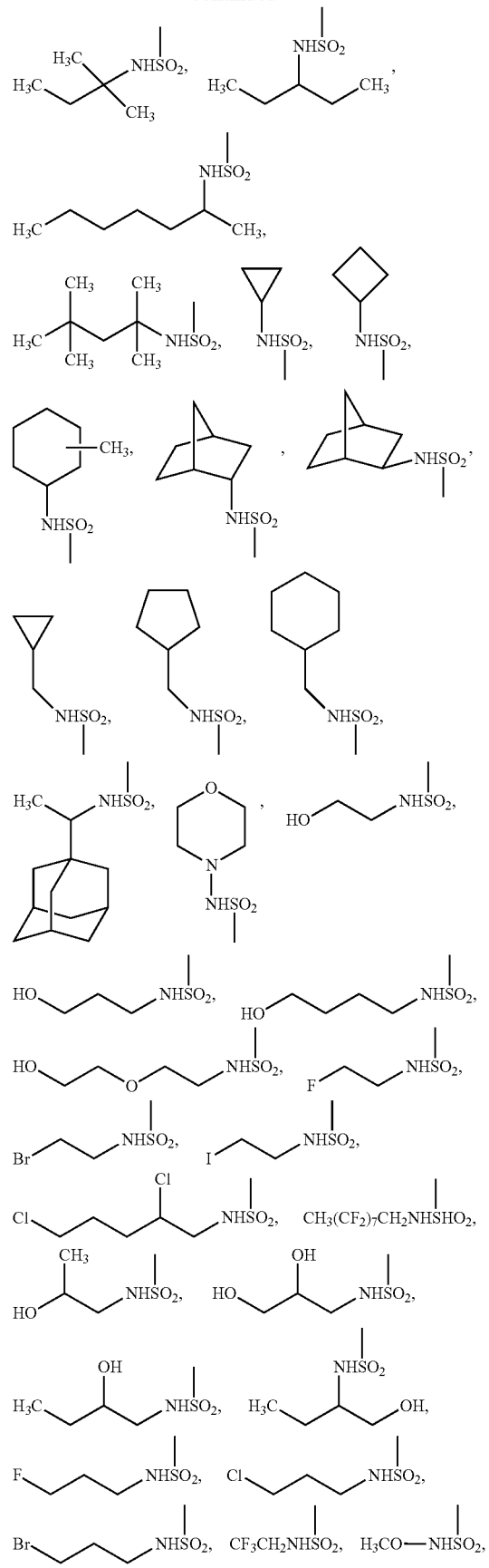

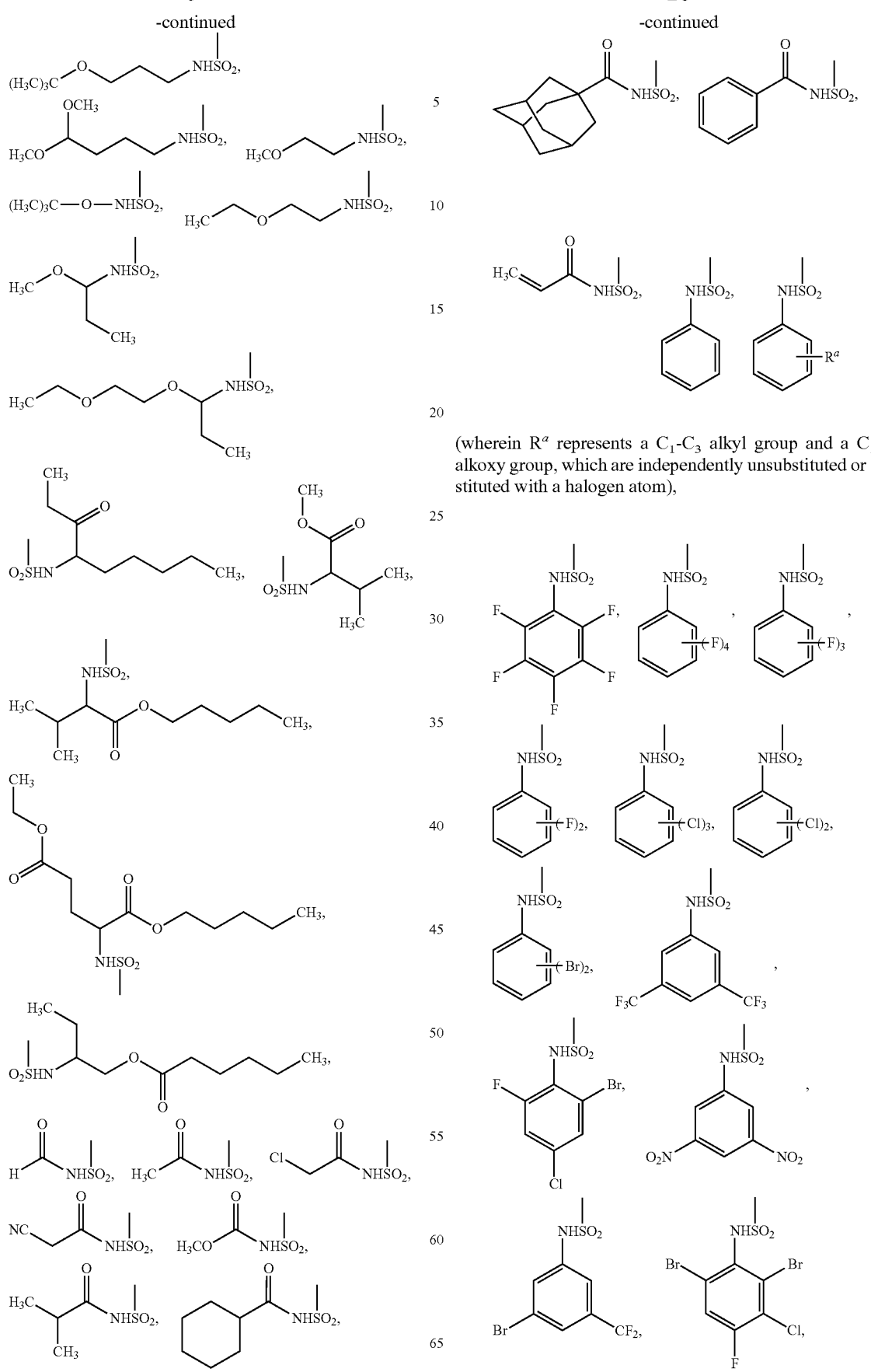
(wherein $R^a$ represents a $C_1$-$C_3$ alkyl group and a $C_1$-$C_3$ alkoxy group, which are independently unsubstituted or substituted with a halogen atom),

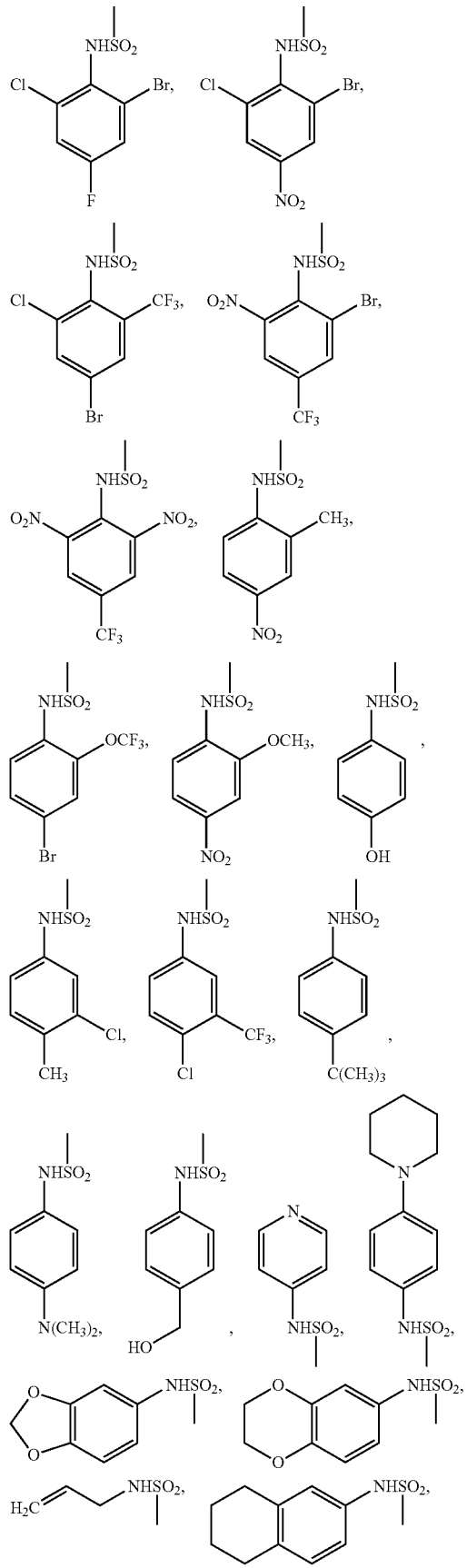
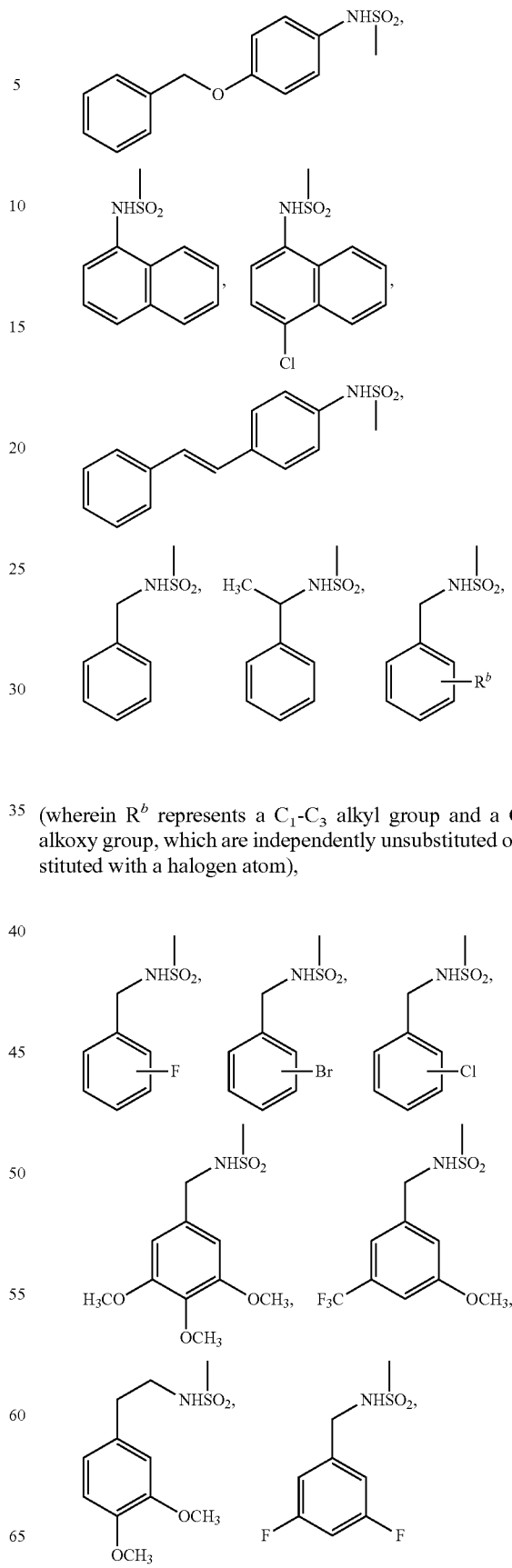
(wherein $R^b$ represents a $C_1$-$C_3$ alkyl group and a $C_1$-$C_3$ alkoxy group, which are independently unsubstituted or substituted with a halogen atom),

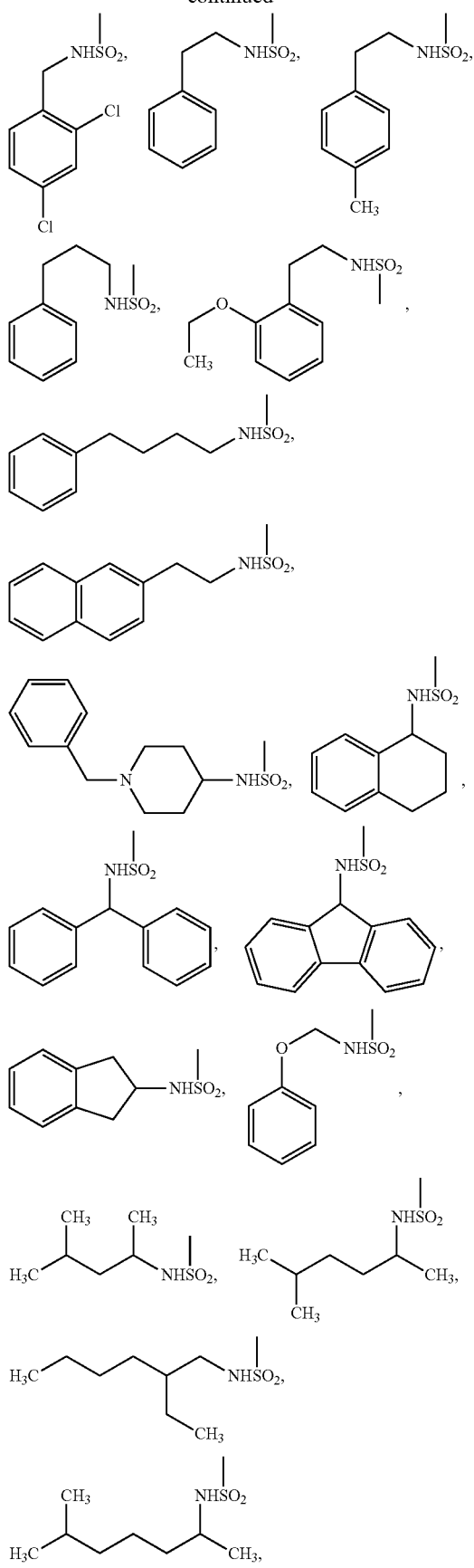
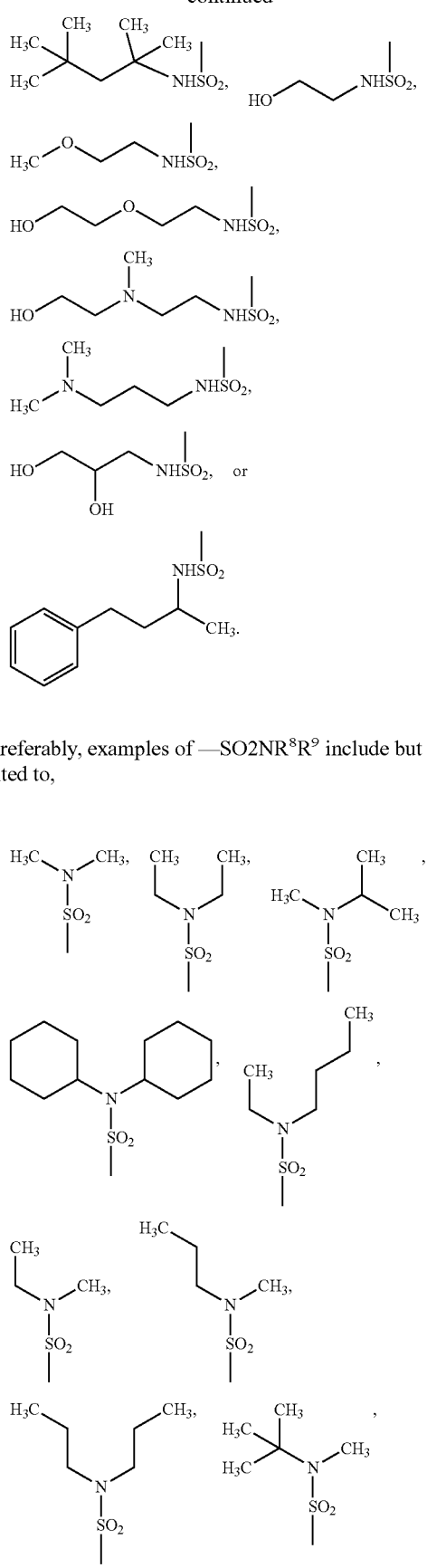
Preferably, examples of —SO2NR⁸R⁹ include but are not limited to, -continued
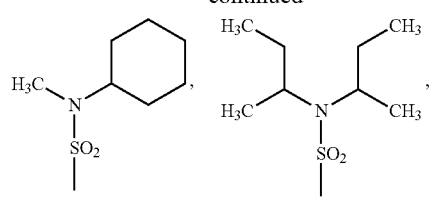
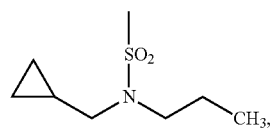
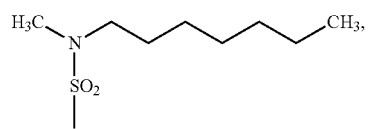
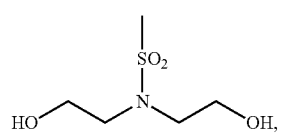
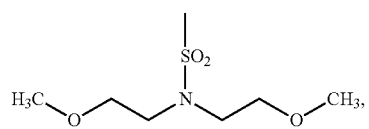
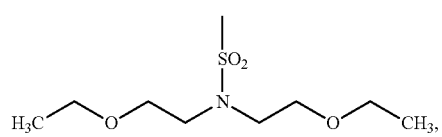
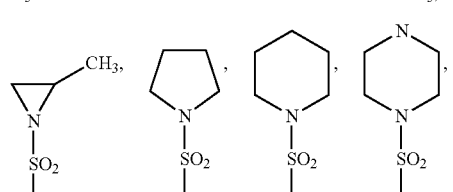
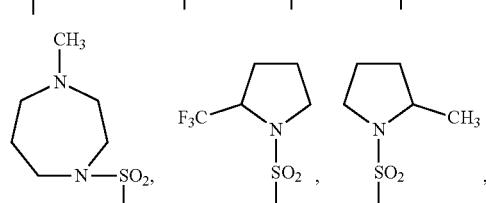
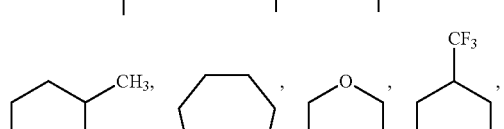
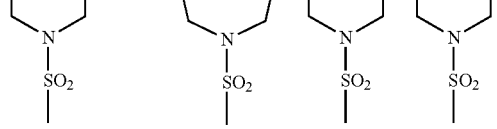
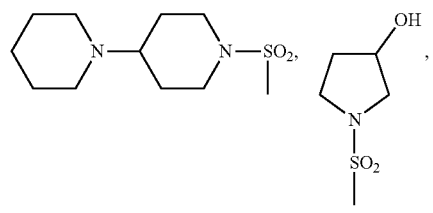
-continued
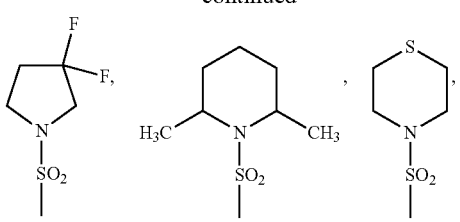
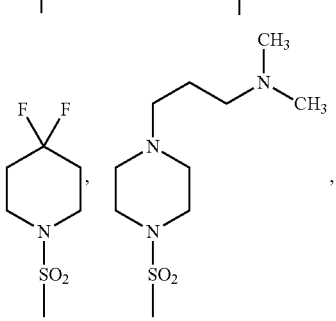
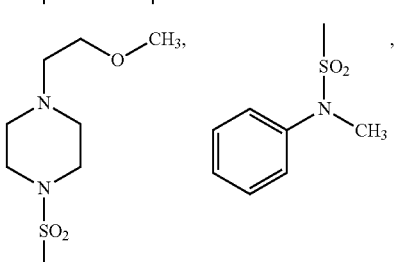
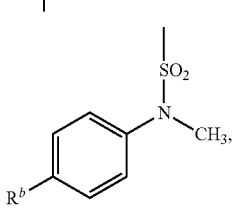
(wherein $R^b$ represents a $C_1$-$C_3$ alkyl group and a $C_1$-$C_3$ alkoxy group, which are independently unsubstituted or substituted with a halogen atom),
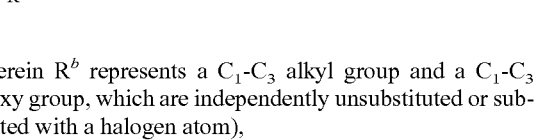
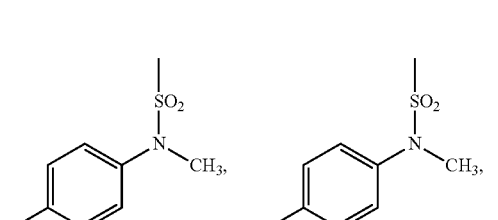
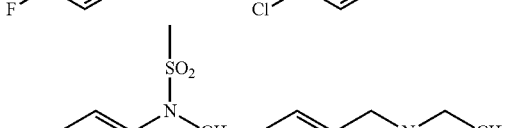
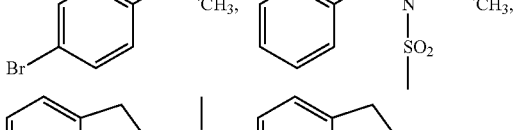
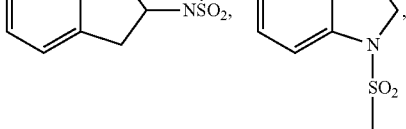

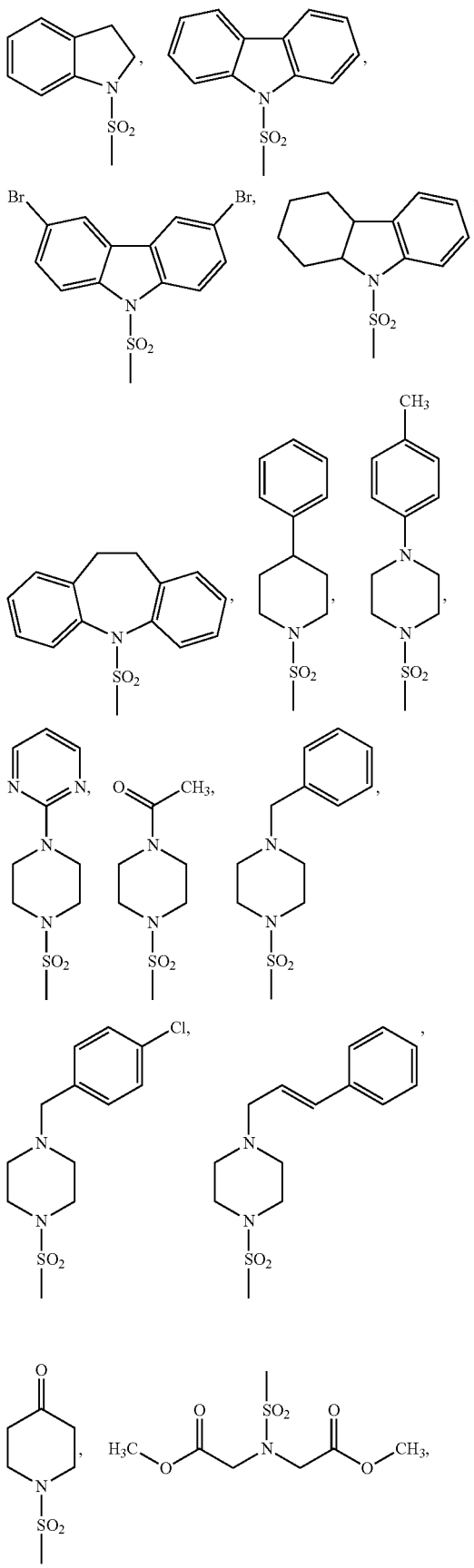

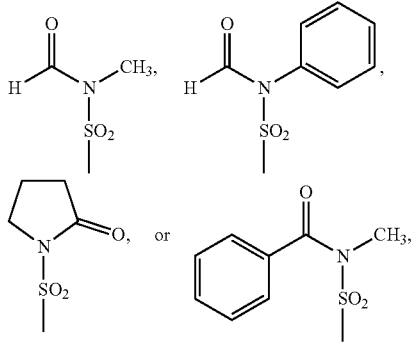

Preferably, the dye (B) includes a red dye represented by Formula (I-1):

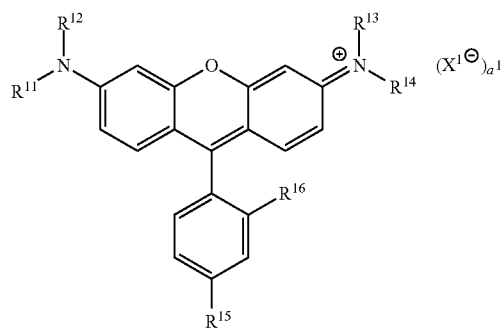

Formula (I-1)

in Formula (I-1):
$R^{11}$, $R^{12}$, $R^{13}$, and $R^{14}$ are independently selected from the group consisting of hydrogen, —$R^6$, and a $C_6$-$C_{10}$ aryl group unsubstituted or substituted with a substituent selected from the group consisting of a halogen atom, —$R^6$, —OH, —$OR^6$, —$SO_3^-$, —$SO_3H$, —$SO_3Na$, —COOH, —$COOR^6$, —$SO_3R^6$, —$SO_2NHR^8$, and —$SO_2NR^8R^9$;
$R^{15}$ is selected from the group consisting of hydrogen, —$SO_3^-$, —$SO_3H$, —$SO_2NHR^8$, and —$SO_2NR^8R^9$;
$R^{16}$ is selected from the group consisting of —$SO_3^-$, —$SO_3H$, —$SO_2NHR^8$, and —$SO_2NR^8R^9$;
$X^1$ represents a halogen atom; and
$a^1$ is 0 or 1.

Preferably, the dye (B) includes a red dye represented by Formula (I-2):

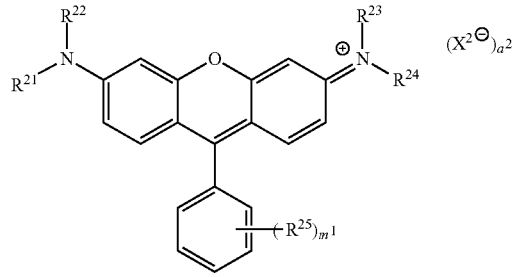

Formula (I-2)

in Formula (I-2):
- $R^{21}$, $R^{22}$, $R^{23}$, and $R^{24}$ are independently selected from the group consisting of hydrogen, —$R^{26}$, and a $C_6$-$C_{10}$ aryl group unsubstituted or substituted with a substituent selected from the group consisting of a halogen atom, —$R^{26}$, —OH, —$OR^{26}$, —$SO_3^-$, —$SO_3H$, —$SO_3Na$, —COOH, —$COOR^{26}$, —$SO_3R^{26}$, and —$SO_2NHR^{28}$;
- $R^{25}$ is selected from the group consisting of —$SO_3^-$, —$SO_3Na$, —COOH, —$COOR^{26}$, —$SO_3H$, and —$SO_2NHR^{28}$;
- $m^1$ is an integer ranging from 0 to 5; when $m^1$ is from 2 to 5, a plurality of $R^{25}$ is the same or different;
- $X^2$ represents a halogen atom;
- $a^2$ is 0 or 1;
- $R^{26}$ is a $C_1$-$C_{10}$ alkyl group unsubstituted or substituted with a substituent selected from the group consisting of halogen and —$OR^{27}$;
- $R^{27}$ is a $C_1$-$C_{10}$ alkyl group; and
- $R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

Preferably, the dye (B) includes a red dye represented by Formula (I-3):

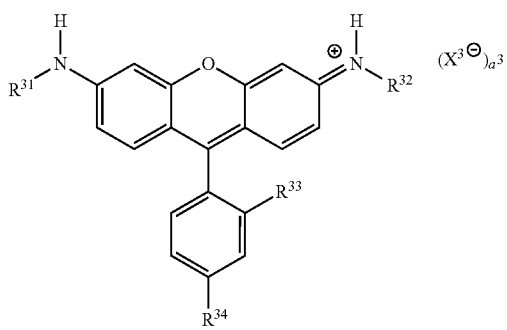

Formula (I-3)

in Formula (I-3):
- $R^{31}$ and $R^{32}$ are independently phenyl unsubstituted or substituted with a substituent selected from the group consisting of halogen atom, —$R^{26}$, —$OR^{26}$, —$COOR^{26}$, —$SO_3R^{26}$, and —$SO_2NHR^{28}$;
- $R^{33}$ is selected from the group consisting of —$SO_3^-$ and —$SO_2NHR^{28}$;
- $R^{34}$ is selected from the group consisting of hydrogen, —$SO_3^-$, and —$SO_2NHR^{28}$;
- $X^3$ represents a halogen atom;
- $a^3$ is 0 or 1;
- $R^{26}$ is a $C_1$-$C_{10}$ alkyl group unsubstituted or substituted with a substituent selected from the group consisting of a halogen atom and —$OR^{27}$;
- $R^{27}$ is a $C_1$-$C_{10}$ alkyl group; and
- $R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

Preferably, the dye (B) includes a red dye represented by Formula (I-4):

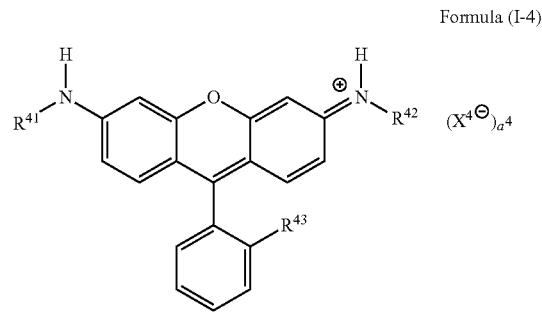

Formula (I-4)

in Formula (I-4):
- $R^{41}$ and $R^{42}$ are independently phenyl unsubstituted or substituted with a substituent selected from the group consisting of —$R^{26}$ and —$SO_2NHR^{28}$;
- $R^{43}$ is selected from the group consisting of —$SO_3^-$ and —$SO_2NHR^{28}$;
- $X^4$ represents a halogen atom;
- $a^4$ is 0 or 1;
- $R^{26}$ is a $C_1$-$C_{10}$ alkyl group unsubstituted or substituted with a substituent selected from the group consisting of a halogen atom and —$OR^{27}$;
- $R^{27}$ is a $C_1$-$C_{10}$ alkyl group; and
- $R^{28}$ is selected from the group consisting of hydrogen, —$R^{26}$, —$COOR^{26}$, and a $C_6$-$C_{10}$ aryl group unsubstituted or substituted with a substituent selected from the group consisting of —$R^{26}$ and —$OR^{26}$.

In one preferred embodiment, examples of the dye (B) include but are not limited to, the following Formulae (1) to (31):

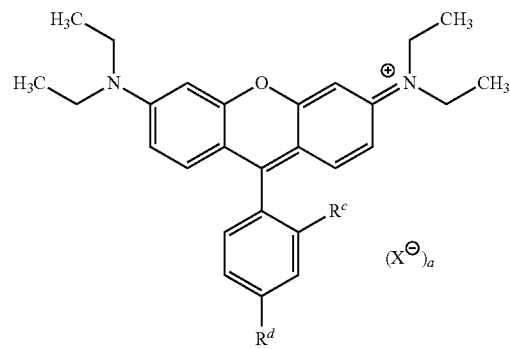

Formula (1)

wherein:
- $R^c$ and $R^d$ are independently selected from the group consisting of hydrogen, —$SO_3^-$, —COOH, and —$SO_2NHR^{81}$;
- $R^{81}$ represents a 2-ethylhexyl group;
- X represents a halogen atom; and
- a is 0 or 1.

Formula (2)

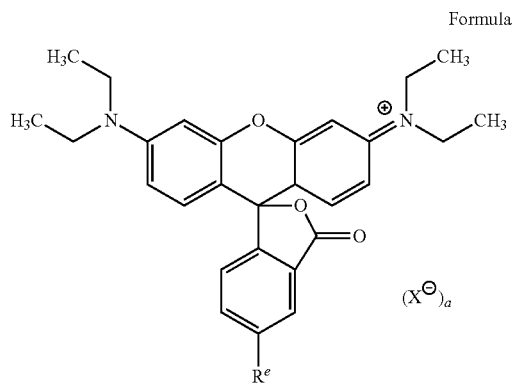

wherein:
$R^e$ is selected from the group consisting of hydrogen, $-SO_3^-$, $-COOH$, and $-SO_2NHR^{81}$;
$R^{81}$ represents a 2-ethylhexyl group;
X represents a halogen atom; and
a is 0 or 1.

Formula (3)

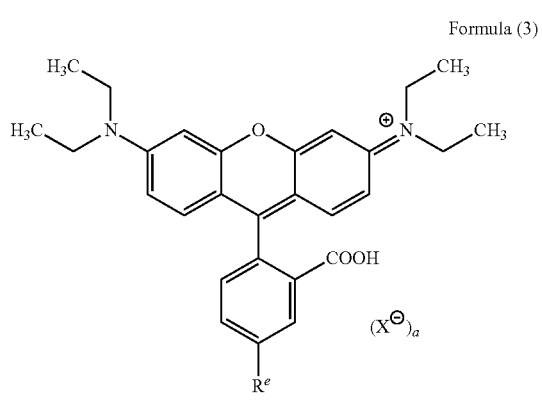

wherein:
$R^e$ is selected from the group consisting of hydrogen, $-SO_3^-$, $-COOH$, and $-SO_2NHR^{81}$;
$R^{81}$ represents a 2-ethylhexyl group;
X represents a halogen atom; and
a is 0 or 1.

Formula (4)

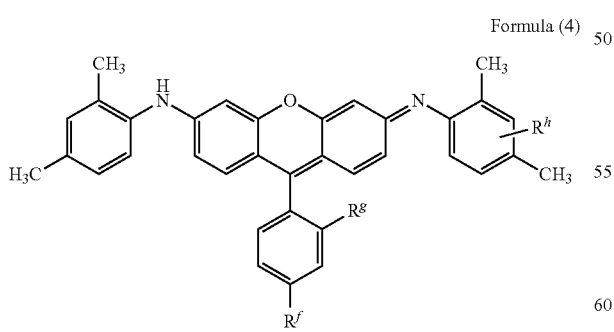

wherein:
$R^f$, $R^g$, and $R^h$ are independently selected from the group consisting of $-SO_3-$, $-SO_3Na$, and $-SO_2NHR^{81}$; and
$R^{81}$ represents a 2-ethylhexyl group.

Formula (5)

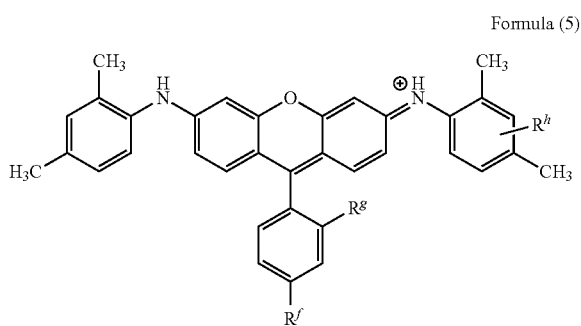

wherein:
$R^f$, $R^g$, and $R^h$ are independently selected from the group consisting of $-SO_3^-$, $-SO_3Na$, and $-SO_2NHR^{81}$; and
$R^{81}$ represents a 2-ethylhexyl group.

Formula (6)

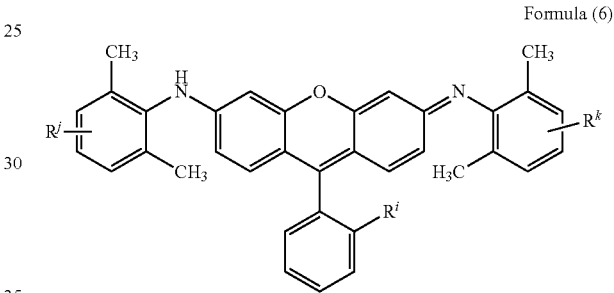

wherein:
$R^i$, $R^j$, and $R^k$ are independently selected from the group consisting of hydrogen, $-SO_3^-$, $-SO_3H$, and $-SO_2NHR^{81}$; and
$R^{81}$ represents a 2-ethylhexyl group.

Formula (7)

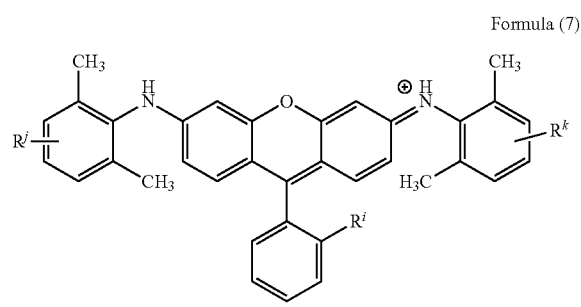

wherein:
$R^i$, $R^j$, and $R^k$ are independently selected from the group consisting of hydrogen, $-SO_3^-$, $-SO_3H$, and $-SO_2NHR^{81}$; and
$R^{81}$ represents a 2-ethylhexyl group.

Formula (8)

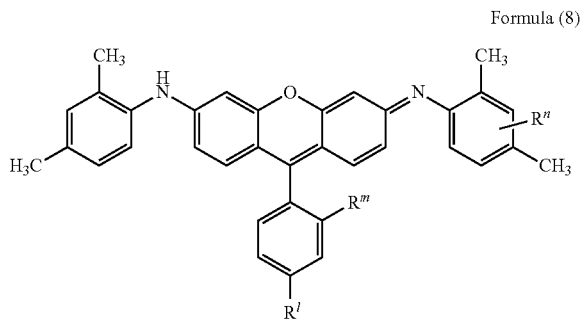

wherein:
$R^l$, $R^m$, and $R^n$ are independently selected from the group consisting of —$SO_3^-$, —$SO_3Na$, and —$SO_2NHR^{81}$; and
$R^{81}$ represents a 2-ethylhexyl group.

Formula (9)

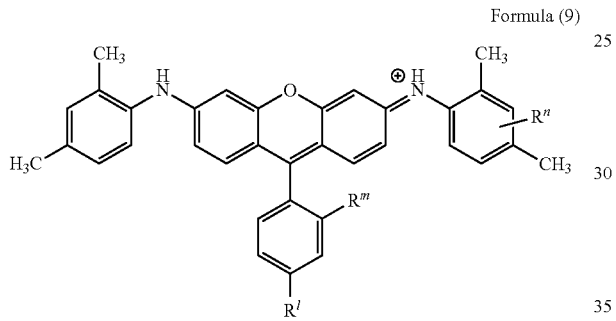

wherein:
$R^l$, $R^m$, and $R^n$ are independently selected from the group consisting of —$SO_3^-$, —$SO_3Na$, and —$SO_2NHR^{81}$; and
$R^{81}$ represents a 2-ethylhexyl group.

Formula (10)

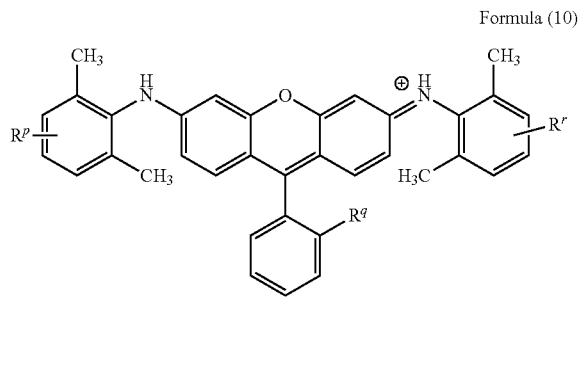

wherein:
$R^p$, $R^q$, and $R^r$ are independently selected from the group consisting of hydrogen, —$SO_3^-$, —$SO_3H$, and —$SO_2NHR^{81}$; and
$R^{81}$ represents a 2-ethylhexyl group.

Formula (11)

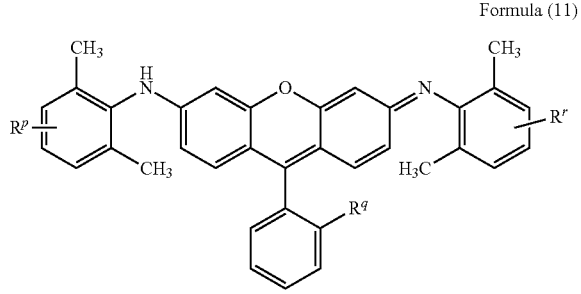

wherein:
$R^p$, $R^q$, and $R^r$ are independently selected from the group consisting of hydrogen, —$SO_3^-$, —$SO_3H$, and —$SO_2NHR^{81}$; and
$R^{81}$ represents a 2-ethylhexyl group.

Formula (12)

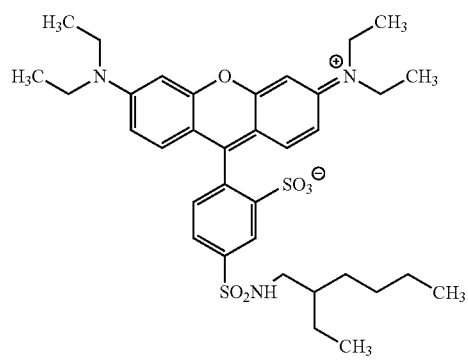

Formula (13)

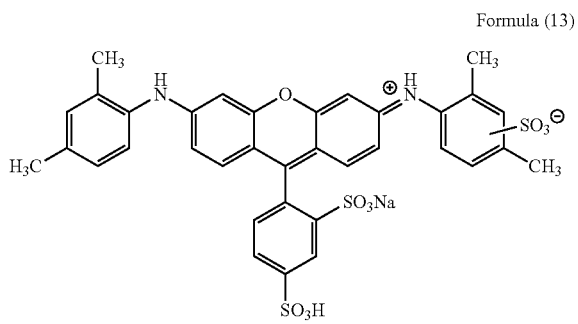

-continued
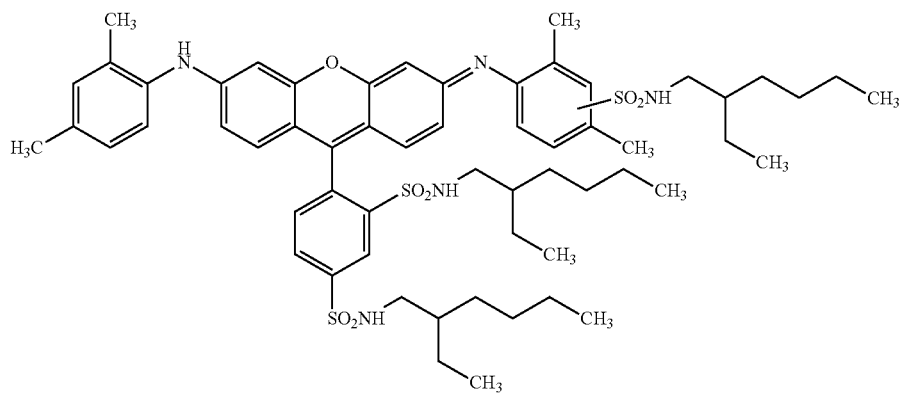
Formula (14)
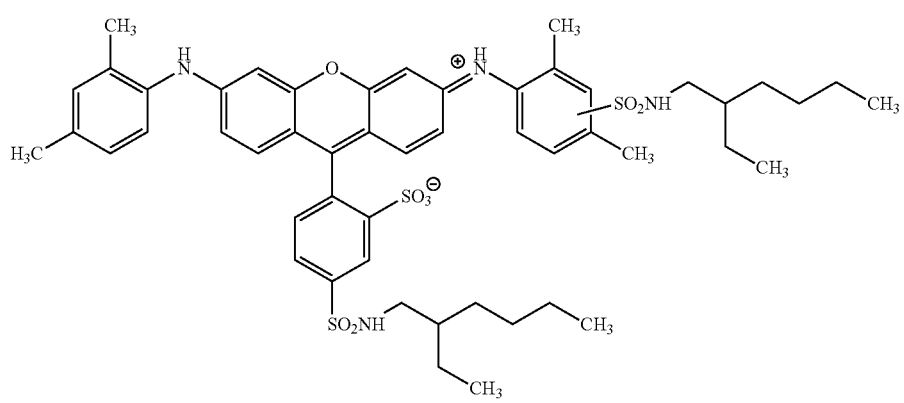
Formula (15)
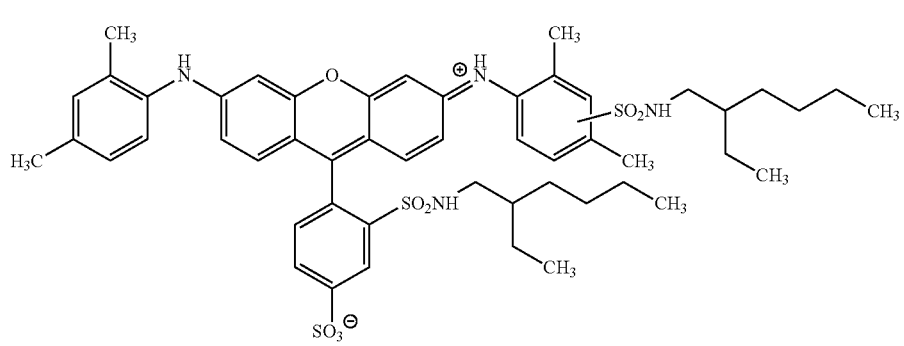
Formula (16)
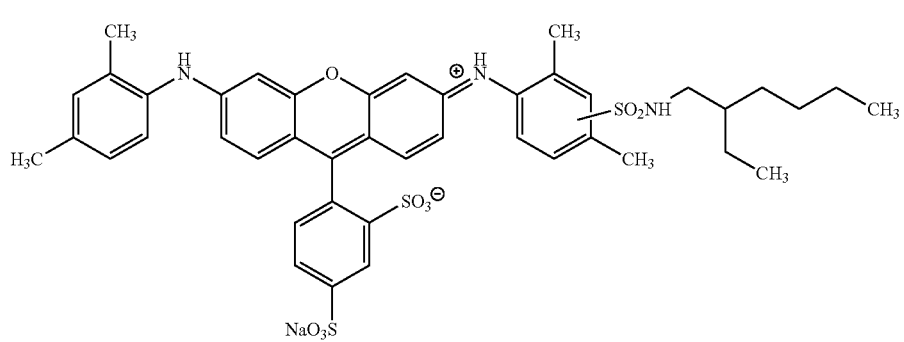
Formula (17)

-continued
Formula (18)
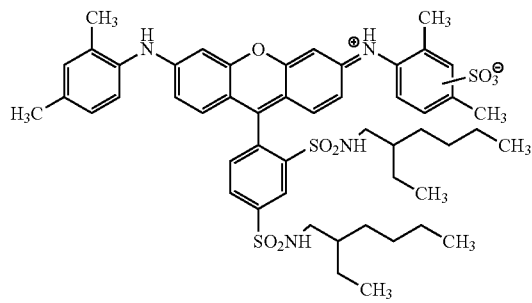
Formula (19)
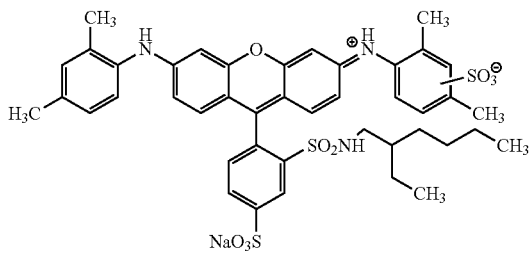
Formula (20)
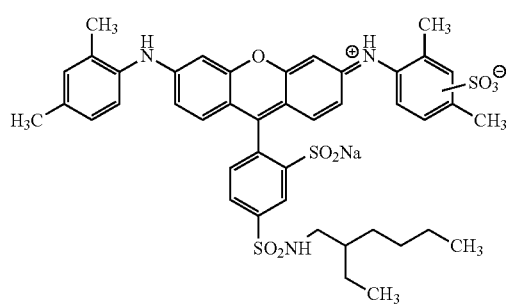
Formula (21)
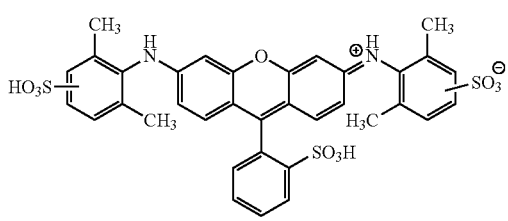
Formula (22)
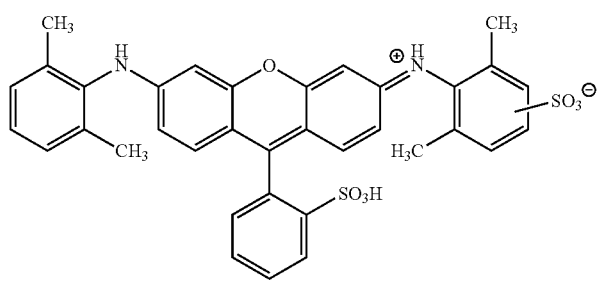
Formula (23)
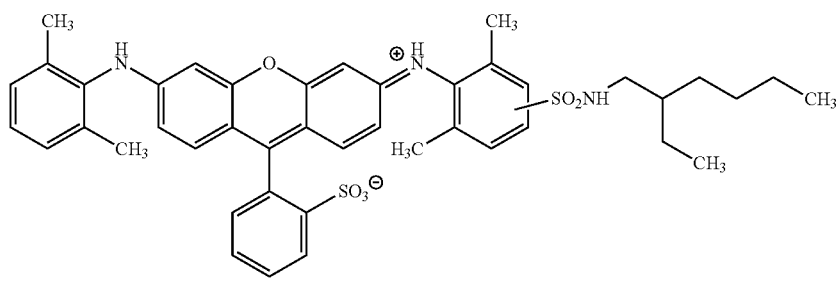
Formula (24)
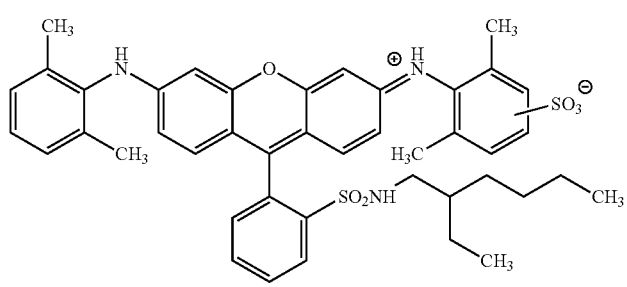

-continued
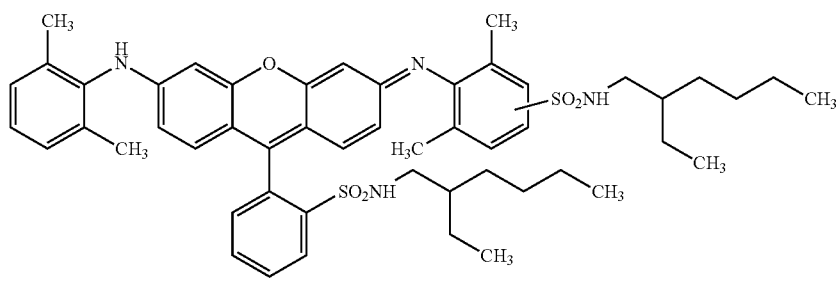
Formula (25)
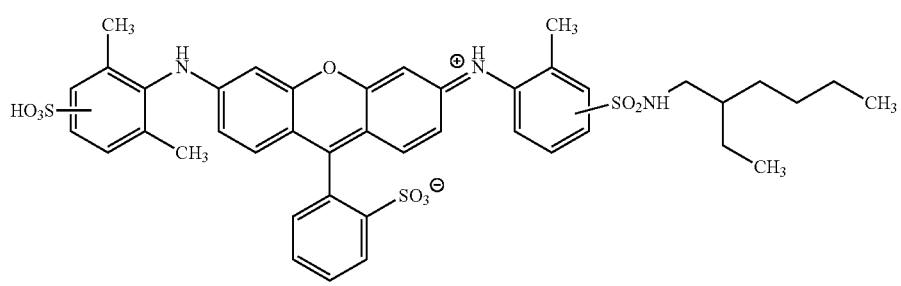
Formula (26)
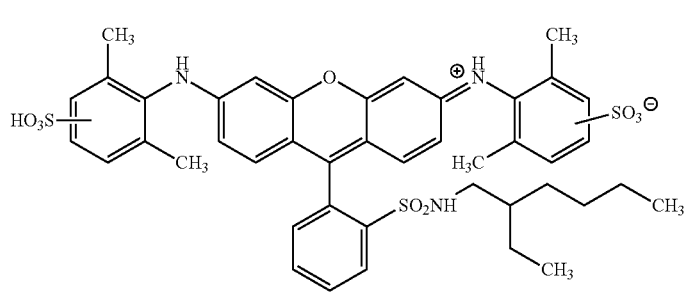
Formula (27)
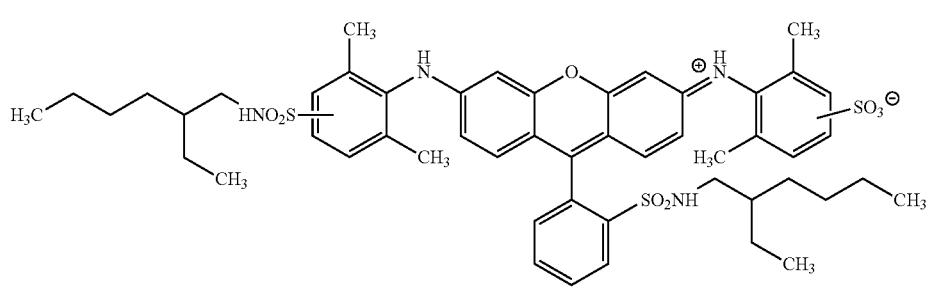
Formula (28)
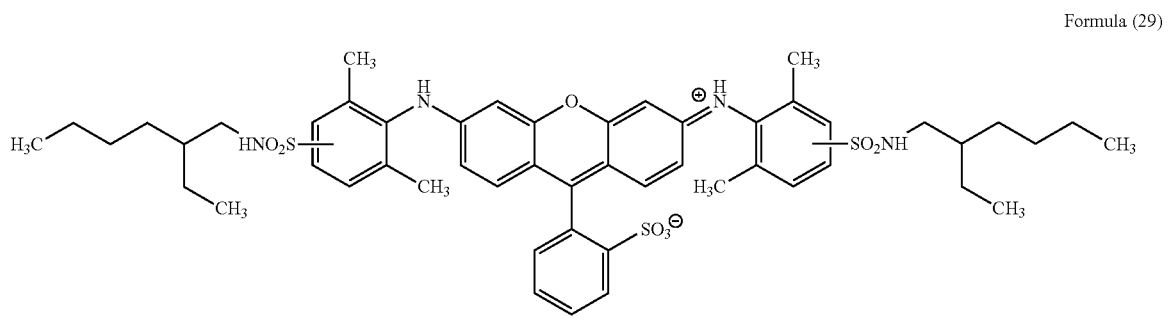
Formula (29)

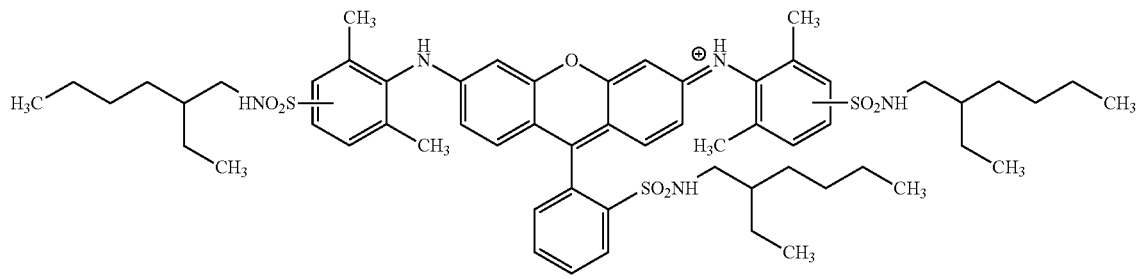

Formula (30)

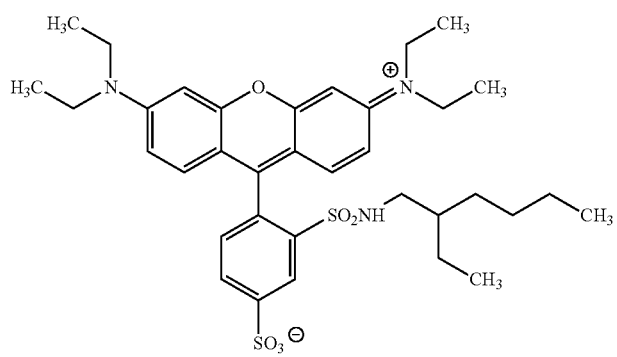

Formula (31)

Preferred examples of the dye (B) include the compound of Formula (1) where $R^c$ and $R^d$ are —$SO_3^-$ and a is 0 (such as C.I. Acid Red 52), the compound of Formula (22) (such as C.I. Acid Red 289), the compound of Formula (28), the compound of Formula (31), and combinations thereof.

In one embodiment of the present invention, based on 100 parts by weight of the total used amount of the alkali-soluble resin (C), the used amount of the dye (B) is 5 parts by weight to 50 parts by weight; preferably 8 parts by weight to 45 parts by weight; more preferably 10 parts by weight to 40 parts by weight. The color liquid crystal display device made without using the dye (B) has the inferior contrast.

The alkali-soluble resin (C) comprises a first alkali-soluble resin (C-1), and the first alkali-soluble resin (C-1) is obtained by polymerizing a mixture comprising an epoxy compound (i) containing at least two epoxy groups, and a compound (ii) containing at least one carboxylic acid group and at least one ethylenically unsaturated group. Besides, the aforementioned mixture can further optionally include a carboxylic acid anhydride compound (iii) and/or an epoxy compound (iv).

The epoxy compound (i) containing at least two epoxy groups according to the present invention can contain a structure represented by Formula (C-I) or Formula (C-II) as below. Herein, "the structure represented by Formula (C-I) or Formula (C-II)" also includes an epoxy compound (i) containing a structure represented by Formula (C-I) and Formula (C-II) at the same time. For example, a structure of the aforementioned epoxy compound (i) contains at least two epoxy groups represented by Formula (C-I):

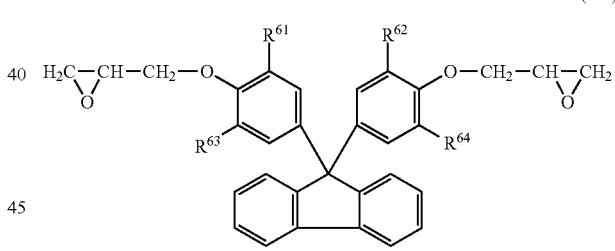

Formula (C-I)

in Formula (C-I), $R^{61}$, $R^{62}$, $R^{63}$, and $R^{64}$ are the same or different from each other; each of which independently represents a hydrogen atom, a halogen atom, a $C_1$-$C_5$ alkyl group, a $C_1$-$C_5$ alkoxy group, a $C_6$-$C_{12}$ aryl group or a $C_6$-$C_{12}$ aromatic alkyl group.

The aforementioned epoxy compound (i) containing at least two epoxy groups represented by Formula (C-I) includes but are not limited to a bisphenol fluorene containing an epoxy group obtained by reacting a bisphenol fluorene and an epihalohydrin.

Examples of the aforementioned bisphenol fluorene are 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene and the combination thereof.

Examples of the aforementioned epihalohydrin include but are not limited to 3-chloro-1,2-epichlorohydrin or 3-bromo-1,2-epibromohydrin.

The aforementioned bisphenol fluorene containing the epoxy group obtained by reacting the bisphenol fluorene and the epihalohydrin includes but are not limited to: (1) ESF-300 manufactured by Nippon Steel Chemical Co., Ltd; (2) PG-100 and EG-210 manufactured by Osaka Gas Co., Ltd; (3) SMS-F9PhPG, SMS-F9CrG, and SMS-F914PG manufactured by S.M.S Technology Co., Ltd.

The aforementioned epoxy compound (i) containing at least two epoxy groups can also contain a structure represented by Formula (C-II):

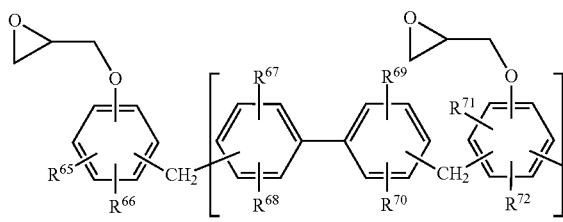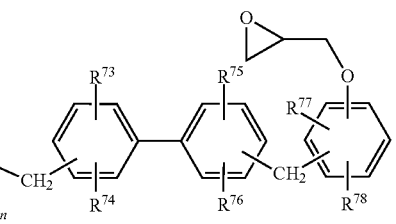

Formula (C-II)

in Formula (C-II), $R^{65}$ to $R^{78}$ are the same or different from each other; each of which independently represents a hydrogen atom, a halogen atom, a $C_1$-$C_8$ alkyl group or a $C_6$-$C_{15}$ aromatic group, and n represents an integer from 0 to 10.

The aforementioned epoxy compound (i) containing at least two epoxy groups represented by Formula (C-II) is obtained by reacting a compound represented by Formula (C-II-1) as below and an epihalohydrin in the presence of an alkali metal hydroxide:

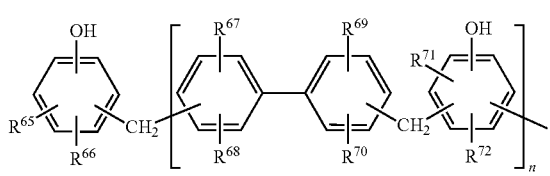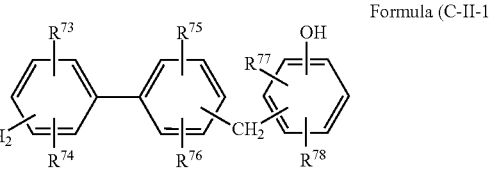

Formula (C-II-1)

in Formula (C-II-1), $R^{65}$ to $R^{78}$ and n are the same to the definition with Formula (C-II), and are not repeated again.

Furthermore, the aforementioned epoxy compound (i) containing at least two epoxy groups represented by Formula (C-II) is condensed with a compound represented by Formula (C-II-2) and phenol in the presence of an acid catalyst, thereby forming the compound represented by Formula (C-II-1). Next, a dehydrohalogenation is carried out by adding excess of an epihalohydrin into the above reaction solution, so as to obtain the epoxy compound (i) containing at least two epoxy groups represented by Formula (C-II):

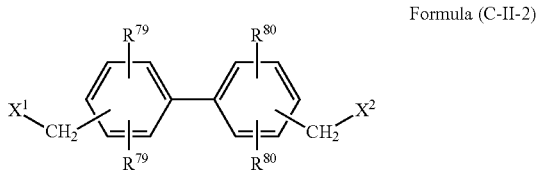

Formula (C-II-2)

In Formula (C-II-2), $R^{79}$ and $R^{80}$ are the same or different from each other, each of which independently represent a hydrogen atom, a halogen atom, a $C_1$-$C_8$ alkyl group or a $C_6$-$C_{15}$ aromatic group; $X^1$ and $X^2$ independently represent a halogen atom, a $C_1$-$C_6$ alkyl group or a $C_1$-$C_6$ alkoxy group. Preferably, the halogen atom may be chlorine or bromine; the alkyl group may be a methyl, ethyl or tert-butyl group; the alkoxy group may be a methoxy or ethoxy group.

Examples of the aforementioned phenol are phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol or the like. The aforementioned phenols can be used alone or in admixture of two or more thereof.

Based on 1 mole of the used amount of the aforementioned compound represented by Formula (C-II-2), the used amount of the phenol is 0.5 to 20 moles; preferably the used amount of the phenol is 2 to 15 moles.

Examples of the aforementioned acid catalyst are hydrogen chloride, sulfuric acid, p-toluenesulfonic acid, oxalic acid, boron trifluoride, aluminium chloride anhydrous, zinc chloride and the like; wherein p-toluenesulfonic acid, hydrogen chloride and sulfuric acid are preferably used. The aforementioned acid catalyst can be used alone or in admixture of two or more thereof.

In addition, there are no specific limitations to the used amount of the aforementioned acid catalyst. Preferably, based on 100 percentages by weight of the compound represented by Formula (C-II-2), the used amount of the acid catalyst is 0.1 to 30 percentages by weight.

The aforementioned condensation reaction can be performed without any solvent or in the presence of an organic solvent. Examples of the aforementioned organic solvent are toluene, xylene, methyl isobutyl ketone or so on. The aforementioned organic solvent can be used alone or in admixture of two or more thereof.

Based on 100 percentages by weight of the total used amount of the compound represented by Formula (C-II-2) and the phenol, the used amount of the organic solvent is 50 percentages by weight to 300 percentages by weight; preferably 100 percentages by weight to 250 percentages by weight.

In addition, the aforementioned condensation reaction is operated under a temperature of 40° C. to 180° C. for a period of 1 hour to 8 hours.

After the condensation reaction is finished, a neutralization or rinse treatment can be performed. In the aforementioned neutralization treatment, pH value of the reaction solution is adjusted to pH 3 to pH 7, and preferably pH 5 to pH 7. A neutralization reagent may be used in the aforementioned rinse treatment, in which the neutralization reagent is an alkaline substance, for examples, alkali metal hydroxides such as sodium hydroxide, potassium hydroxide and the like; alkaline earth metal hydroxides such as calcium hydroxide, magnesium hydroxide and the like; organic amines such as diethylene triamine, triethylenetetramine, aniline, phenylene diamine and the like; and ammonia, sodium dihydrogen phosphate and so on. Conventional methods can be used in the aforementioned rinse treatment. For example, a neutralizing reagent-containing solution is added into the reaction solution followed by repetitively extracting. After the neutralization or rinse treatment is finished, unreactive phenols and solvents in the product are evaporated and removed by using a heating treatment under a decreased pressure, and then concentrated, thereby obtaining the compound represented by Formula (C-II-1).

Examples of the aforementioned epihalohydrin are 3-chloro-1,2-epichlorohydrin, 3-bromo-1,2-epibromohydrin and the combination thereof. Before preceding the aforementioned dehydrohalogenation, alkali metal hydroxides such as sodium hydroxide, potassium hydroxide can be added before or during the reaction process. The aforementioned dehydrohalogenation is carried out under a temperature of 20° C. to 120° C. for a period of 1 hour to 10 hours.

In an embodiment, the formulation of the alkali metal hydroxide can be also used in an aqueous solution for adding into the aforementioned dehydrohalogenation reaction system. In the example, when the solution of the alkali metal hydroxides is continuously added into the dehydrohalogenation reaction system, water and the epihalohydrin can be simultaneously distilled out under a normal or decreased pressure, thereby separating and removing water, as well as reflowing the epihalohydrin back into the reaction system continuously.

Before the aforementioned dehydrohalogenation is carried out, a tertiary ammonium salt such as tetramethyl ammonium chloride, tetramethyl ammonium bromide, trimethyl benzyl ammonium chloride or the like can be used as a catalyst and added into the dehydrohalogenation reaction system, followed by performing the dehydrohalogenation under a temperature of 50° C. to 150° C. for a period of 1 hour to 5 hours. Next, the alkali metal hydroxide or its solution can be then added into such reaction system under a temperature of 20° C. to 120° C. for a period of 1 hour to 10 hours for carrying out the dehydrohalogenation.

Based on the total hydroxyl groups in the compound represented by Formula (C-II-1) as 1 equivalent, the used amount of the epihalohydrin is 1 to 20 equivalents; preferably 2 to 10 equivalents. Based on the total hydroxyl groups in the compound represented by Formula (C-II-1) as 1 equivalent, the used amount of the alkali metal hydroxide added in the dehydrohalogenation is 0.8 to 15 equivalents; preferably 0.9 to 11 equivalents.

In addition, for the purpose of successful of the dehydrohalogenation, a polar aprotic solvent such as dimethyl sulfone, dimethyl sulfoxide and the like can be also added. When an alcohol is used in the reaction, based on 100 percentages by weight of the total used amount of the epihalohydrin, the used amount of the alcohol is 2 to 20 percentages by weight; preferably 4 to 15 percentages by weight. When the polar aprotic solvent is used in the reaction, based on 100 percentages by weight of the total used amount of the epihalohydrin, the used amount of the polar aprotic solvent is 5 to 100 percentages by weight; preferably 10 to 90 percentages by weight.

After the dehydrohalogenation is completed, a rinse treatment is optionally performed. Afterward, the epihalohydrin, the alcohol and the polar aprotic solvent can be removed by using a heating treatment of 110° C. to 250° C. under a decreased pressure of less than 1.3 kPa (10 mmHg).

For preventing the resulted epoxy resin from remaining hydrolytic halogen therein, toluene, methyl isobutyl ketone or the like can be added into the solution that has reacted after the dehydrohalogenation, and then the solution of the alkali metal hydroxide such as sodium hydroxide, potassium hydroxide can be added to perform the dehydrohalogenation again. During the dehydrohalogenation, based on the total hydroxyl groups in the compound represented in Formula (C-II-1) as 1 equivalent, the used amount of the alkali metal hydroxide added in the dehydrohalogenation is 0.01 to 0.3 moles; preferably 0.05 to 0.2 moles. In addition, the dehydrohalogenation is operated in a temperature of 50° C. to 120° C. for a period of 0.5 hour to 2 hours.

After the dehydrohalogenation is finished, salts can be removed by using processes of filtration, rinse and so on. In addition, toluene, methyl isobutyl ketone or the like can be distilled out and removed, thereby obtaining an epoxy compound having at least two epoxy groups (i) represented by Formula (C-II). The epoxy compound having at least two epoxy groups (i) represented by Formula (C-II) includes but is not limited to the commercially available products such as NC-3000, NC-3000H, NC-3000S, NC-3000P and the like manufactured by Nippon Kayaku Co., Ltd.

The aforementioned compound having at least one carboxyl group and ethylenically unsaturated group (ii) is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl cis-hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl hydrophthalic acid, 2-methacryloyloxybutyl hexahydrophthalic acid or 2-methacryloyloxybutyl hydrophthalic acid; (2) a compound obtained by reacting (methyl)acrylate ester containing a hydroxyl group with a dicarboxylic acid compound, in which the dicarboxylic acid compound may include but be not limited to hexanedioic acid, butanedioic acid, maleic acid and phthalic acid; (3) a compound obtained by reacting (methyl)acrylate ester containing a hydroxyl group with a carboxylic acid anhydride compound (iii), in which the (methyl)acrylate ester containing a hydroxyl group may include but be not limited to (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, pentaerythritol triacrylate and so on. In addition, the carboxylic acid anhydride compound described herein is the same with the carboxylic acid anhydride compound (iii) in the aforementioned mixture of the resin containing an unsaturated group (A-1) rather than being recited herein.

As aforementioned, the mixture of the first alkali-soluble resin (C-1) can optionally include the carboxylic acid anhydride compound (iii) and/or the compound containing an epoxy group (iv). The carboxylic acid anhydride compound (iii) can be selected from the group consisting of the following subgroups (1) to (2): (1) a dicarboxylic acid anhydride compound such as butanedioic anhydride, maleic anhydride, Itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydro phthalic anhydride, chlorendic anhydride, 1,3-dioxoisobenzofuran-5-carboxylic anhydride and the like; and (2) a tetracarboxylic acid anhydride compound such as benzophenone tetracarboxylic dianhydride (BTDA), diphthalic dianhydride, diphenyl ether tetracarboxylic acid dianhydride and the like.

The aforementioned compound containing the epoxy group (iv) is selected from the group consisting of glycidyl methacrylate, 3,4-epoxycyclohexyl methacrylate, glycidyl ether compound containing a unsaturated group, unsaturated compound containing a epoxy group or any combination thereof. The glycidyl ether compound containing an unsaturated group may include but be not limited to the commercially available products such as Denacol EX-111, Denacol EX-121, Denacol EX-141, Denacol EX-145, Denacol EX-146, Denacol EX-171, Denacol EX-192 and so on manufactured by Nagase ChemteX Corporation.

The aforementioned first alkali-soluble resin (C-1) can be synthesized as follows. The epoxy compound containing at least two epoxy groups (i) represented by Formula (C-I) and the compound containing at least one carboxyl group and ethylenically unsaturated group (ii) are polymerized and formed to an intermediate product containing a hydroxyl group, and then the intermediate product reacts with the carboxylic acid anhydride compound (iii), so as to obtain the first alkali-soluble resin (C-1). Based on the total amount of the hydroxyl group as 1 equivalent, the used amount of the carboxylic acid anhydride compound (iii) preferably is 0.4 to 1 equivalent; more preferably 0.75 to 1 equivalent. When a plurality of the carboxylic acid anhydride compound (iii) is used in this reaction, they can be added sequentially or simultaneously in the reaction. Preferably, when the dicarboxylic acid anhydride compound and the tetracarboxylic acid anhydride compound are employed as the carboxylic acid anhydride compound (iii), the molar ratio of dicarboxylic acid anhydride compound to the tetracarboxylic acid anhydride compound may be 1/99 to 90/10, and preferably 5/95 to 80/20. In addition, this reaction can be operated under a temperature of 50° C. to 130° C.

The aforementioned first alkali-soluble resin (C-1) can be synthesized as follows. The epoxy compound containing at least two epoxy groups (i) represented by Formula (C-II) and the compound containing at least one carboxyl group and at least one ethylenically unsaturated group (ii) are polymerized and formed to an intermediate product containing a hydroxyl group, and then the intermediate product reacts with the carboxylic acid anhydride compound (iii) and/or compound containing epoxy group(s) (iv), so as to obtain first alkali-soluble resin (C-1). Based on the total amount of the epoxy group of the epoxy compound containing at least two epoxy groups (i) represented by Formula (C-II), the used amount of the compound containing at least one carboxyl group and at least one ethylenically unsaturated group (ii) is 0.8 to 1.5 equivalent; preferably 0.9 to 1.1 equivalent. Based on the total hydroxyl group used amount of the intermediate product containing the hydroxyl group as 100 percentage by mole (mole %), the used amount of the carboxylic acid anhydride compound (iii) is 10 to 100 mole %; preferably 20 to 100 mole %; more preferably 30 to 100 mole %.

During the preparation of the first alkali-soluble resin (C-1), the reaction solution is usually added with an alkaline compound as a reaction catalyst for accelerating the reaction. The reaction catalyst may be used alone or in combinations of two or more, and the reaction may include but not limited to triphenyl phosphine, triphenyl stibine, triethylamine, triethanolamine, tetramethylammonium chloride, benzyltriethylammonium chloride and the like. Preferably, based on 100 parts by weight of the total used amount of the epoxy compound containing at least two epoxy groups (i) and the compound containing at least one carboxyl group and at least one ethylenically unsaturated group (ii), the used amount of the reaction catalyst is 0.01 to 10 parts by weight, and preferably 0.3 to 5 parts by weight.

In addition, for the purpose of controlling the polymerization degree, a polymerization inhibitor is usually added into the reaction solution. The aforementioned polymerization inhibitor includes but is not limited to methoxyphenol, methylhydroquinone, hydroquinone, 2,6-di-t-butyl-p-cresol, phenothiazine and the like. Typically, the polymerization inhibitor may be used alone or in combinations of two or more. Based on 100 parts by weight of the total used amount of the epoxy compound containing at least two epoxy groups (i) and the compound containing at least one carboxyl group and ethylenically unsaturated group (ii), the used amount of the polymerization inhibitor is 0.01 to 10 parts by weight; preferably 0.1 to 5 parts by weight.

During the preparation of the first alkali-soluble resin (C-1), a polymerization solvent can be used if necessary. Examples of the polymerization solvent may include but not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol)alkyl ether compounds such as di(propylene glycol) methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization solvent may be used alone or in combinations of two or more. An acid equivalent of the first alkali-soluble resin (C-1) is 50 mg KOH/g to 200 mg KOH/g, and preferably 60 mg KOH/g to 150 mg KOH/g.

If the first alkali-soluble resin (C-1) is absent, the developing-resistance is poor.

In addition, the average molecular weight of polystyrene of the aforementioned first alkali-soluble resin (C-1) measured by Gel Permeation Chromatography is 800 to 8000; preferably 1000 to 6000.

Preferably, the alkali-soluble resin (C) according to the present invention further comprises a second alkali-soluble resin (C-2). The second alkali-soluble resin (C-2) is obtained by copolymerizing an ethylenically unsaturated monomer containing one or more carboxyl groups and other copolymerizable ethylenically unsaturated monomer. Preferably, based on 100 parts by weight of the used amount of the other copolymerizable monomer, the second alkali-soluble resin (C-2) is obtained by copolymerizing the ethylenically unsaturated monomer containing one or more carboxyl groups used in the copolymerization reaction are 50 to 95 parts by weight and 5 to 50 parts by weight, respectively.

The ethylenically unsaturated monomer containing one or more carboxyl groups can be used alone or in admixture of two or more thereof, and the ethylenically unsaturated monomer includes but is not limited to unsaturated monocarboxylic acids, such as acrylic acid, methacrylic acid, butenoic acid, α-chloroacrylic acid, ethacrylic acid, cinnamic acid, 2-acryloylethoxy succinate, 2-methacryloylethoxy succinate, or the like; unsaturated dicarboxylic acids and/or anhydrides thereof, such as maleic acid, maleic anhydride, fumaric acid, itaconic acid, itaconic anhydride, citraconic acid, citraconic anhydride, or the like; and unsaturated polycarboxylic acids having at least three carboxyl groups in the molecules and/or anhydrides thereof. Preferably, the ethylenically unsaturated monomer having one or more carboxyl groups is selected from acrylic acid, methacrylic acid, 2-acryloylethoxy succinate, and 2-methacryloylethoxy succinate. More preferably, the ethylenically unsaturated monomer having one or more carboxyl groups is selected from 2-acryloylethoxy succinate and 2-methacryloylethoxy succinate. The ethylenically unsaturated monomer having one or more carboxyl groups is used for increasing the pigment dispersion, enhancing the development speed, and reducing the residue.

The other copolymerizable ethylenically unsaturated monomer can be used alone or in admixture of two or more thereof, and the other copolymerizable ethylenically unsaturated monomer includes but is not limited to vinyl aromatic compounds, such as styrene, α-methyl styrene, vinyl toluene, p-chlorostyrene, methoxystyrene, or the like; maleimides, such as N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide, or the like; unsaturated carboxylates, such as methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate, dicyclopentenyloxyethyl acrylate, or the like; N,N-dimethyl aminoethyl acrylate, N,N-dimethyl aminoethyl methacrylate, N,N-diethyl aminopropyl acrylate, N,N-dimethyl aminopropyl methacrylate, N,N-dibutyl aminopropyl acrylate, isobutylaminoethyl N-methylacrylate, or the like; unsaturated glycidyl carboxylates, such as glycidyl acrylate, glycidyl methacrylate, or the like; vinyl carboxylates, such as vinyl acetate, vinyl propionate, vinyl butyrate, or the like; unsaturated ethers, such as vinyl methyl ether, vinyl ethyl ether, allyl glycidyl ether, methallyl glycidyl ether, or the like; vinyl cyanides, such as acrylonitrile, methyl acrylonitrile, α-chloroacrylonitrile, vinylidene cyanide, or the like; unsaturated amides, such as acrylamide, methacrylamide, α-chloroacrylamide, N-hydroxyethyl acrylamide, N-hydroxyethyl methacrylamide, or the like; and aliphatic conjugate dienes, such as 1,3-butadiene, isoprene, chloroprene, or the like.

Preferably, the other copolymerizable ethylenically unsaturated monomer is selected from styrene, N-phenylmaleimide, methyl acrylate, methyl methacrylate, 2-hydroxyethyl acrylate, 2-hydroxyethyl methacrylate, benzyl acrylate, benzyl methacrylate, dicyclopentenyloxyethyl acrylate, and combinations thereof.

When preparing the second alkali-soluble resin (C-2), a solvent can be used alone or in admixture of two or more thereof and the solvent includes but is not limited to, (poly) alkylene glycol monoalkyl ethers, such as ethylene glycol methyl ether, ethylene glycol ethyl ether, diethylene glycol methyl ether, diethylene glycol ethyl ether, diethylene glycol n-propyl ether, diethylene glycol n-butyl ether, triethylene glycol methyl ether, triethylene glycol ethyl ether, propylene glycol methyl ether, propylene glycol ethyl ether, dipropylene glycol methyl ether, dipropylene glycol ethyl ether, dipropylene glycol n-propyl ether, dipropylene glycol n-butyl ether, tripropylene glycol methyl ether, tripropylene glycol ethyl ether, or the like; (poly)alkylene glycol monoalkyl ether acetates, such as ethylene glycol methyl ether acetate, ethylene glycol ethyl ether acetate, propylene glycol methyl ether acetate, propylene glycol ethyl ether acetate, or the like; other ethers, such as diethylene glycol dimethyl ether, diethylene glycol methyl ethyl ether, diethylene glycol diethyl ether, tetrahydrofuran, or the like; ketones, such as methyl ethyl ketone, cyclohexanone, 2-heptanone, 3-heptanone, or the like; alkyl lactate, such as methyl 2-hydroxypropionate, ethyl 2-hydroxypropionate, or the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, iso-butyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-methoxybutyrate, or the like; aromatic hydrocarbons, such as toluene, xylene, or the like; and carboxylic acid amide, such as N-methyl-2-pyrrolidone, N,N-dimethylformamide, N,N-dimethylacetamide, or the like. Preferably, the solvent is selected from propylene glycol methyl ether acetate, ethyl 3-ethoxypropionate, and a combination thereof. Examples of the (poly) alkylene glycol monoalkyl ethers include alkylene glycol monoalkyl ethers and polyalkylene glycol monoalkyl ethers. Examples of the (poly)alkylene glycol monoalkyl ether acetates include alkylene glycol monoalkyl ether acetates and polyalkylene glycol monoalkyl ether acetates.

An initiator used for preparing the second alkali-soluble resin (C-2) is a free radical polymerization initiator, examples of the initiator an azo compound, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methylbutyronitrile, or the like; and a peroxide, such as benzoyl peroxide, or the like.

When using the second alkali-soluble resin (C-2), the developing-resistance is improved.

In addition, the average molecular weight of polystyrene of the aforementioned second alkali-soluble resin (C-2) mearsured by Gel Permeation Chromatography is 3000 to 30000; preferably 5000 to 25000.

In one preferred embodiment of the present invention, the ratio (C-1)/(C-2)) of the first alkali-soluble resin (C-1) and the second alkali-soluble resin (C-2) is from 100/0 to 30/70; preferably 100/0 to 40/60; more preferably 100/0 to 50/50.

Based on 100 parts by weight of the total used amount of the alkali-soluble resin (C), the used amount of the first alkali-soluble resin (C-1) is from 30 parts by weight to 100 parts by weight; preferably 40 parts by weight to 100 parts by weight; more preferably 50 parts by weight to 100 parts by weight.

Based on 100 parts by weight of the total used amount of the alkali-soluble resin (C), the used amount of the second alkali-soluble resin (C-2) is from 0 parts by weight to 70 parts by weight; preferably 0 parts by weight to 60 parts by weight; more preferably 0 parts by weight to 50 parts by weight.

The blue photosensitive resin composition for the color filter according to the present invention comprises a cationic polymeric compound (D). If the cationic polymeric compound (D) is absent, the ageing stability of sensitivity and developing-resistance are poor.

Based on 100 parts by weight of the total used amount of the alkali-soluble resin (C), the used amount of the cationic polymeric compound (D) is from 20 parts by weight to 200 parts by weight; preferably 25 parts by weight to 180 parts by weight; more preferably 30 parts by weight to 150 parts by weight.

In one preferred embodiment of the present invention, the cationic polymeric compound (D) comprises a compound (D-1) containing an oxetanyl group.

The compound (D-1) containing the oxetanyl group, for example, are trimethylene oxide, 3,3-dimethyl oxetane, 3,3-dichloro-methyl oxetane, 3-ethyl-3-phenoxymethyl oxetane, 3-ethyl-3-hydroxymethyloxetane, 1,4-bis{[(3-ethyloxetan-3-yl)methoxy]methyl}benzene, bis[1-ethyl(3-oxetanyl)]methyl ether, 3-ethyl-3-(2-ethyl xylo carboxymethyl)oxetane, 3-ethyl-3-(cyclohexyloxy)methyloxetane, 1,3-bis[(3-ethyloxetan-3-yl)methoxy]benzene, or the derivative of the aforementioned compound, such as OXT-121 (Formula (32)), OXT-213(Formula (33)), OXT-221(Formula (34)), OXT-101 (Formula (35)), OXT-212(Formula (36))(all manufactured by Toagosei Co., Ltd).

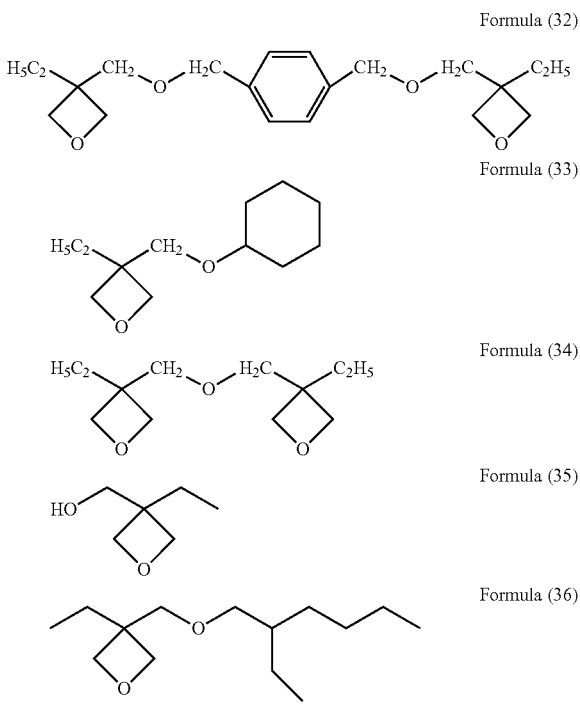

Formula (32)
Formula (33)
Formula (34)
Formula (35)
Formula (36)

When using the compound (D-1) containing the oxetanyl group, the ageing stability of sensitivity is improved.

In one preferred embodiment of the invention, the cationic polymeric compound (D) comprises an other cationic polymeric compound (D-2). Examples of the other cationic polymeric compound (D) include but are not limited to an epoxy compound, oxolane compound, cyclic acetal compound, cyclic lactone compound, thiirane compound, thietane compound, spiroorthoester compound formed by reacting a lactone compound and an epoxy compound, vinyl ether compound, or other compound having an ethylenically unsaturated group.

Examples of the epoxy compound include but are not limited to bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxy cyclohexane carboxylate, 2-(3,4-epoxy cyclohexyl-5,5-spiro-3,4-epoxy)cyclohexane-meta-dioxane, bis(3,4-epoxycyclohexylmethyl) adipate, bis(3,4-epoxy-6-methylcyclohexylmethyl) adipate, 3,4-epoxy-6-methyl-3',4'-epoxy-6'-methylcyclohexane carboxylate, ε-caprolactone-modified 3,4-epoxycyclohexylmethyl-3'3,4,4'-epoxy cyclohexane carboxylate, trimethylcaprolactone-modified epoxycyclohexyl-methyl-3',4'-epoxy cyclohexane carboxylate, β-methyl-δ-valerolactone-modified 3,4-epoxycyclohexylmethyl-3',4'-epoxy cyclohexane carboxylate, methylenebis(3,4-epoxycyclohexane), ethylene glycol of di(3,4-epoxycyclohexylmethyl) ether, ethylene his (3,4-epoxy cyclohexane carboxylate), epoxy cyclo hexahydro di-n-octyl phthalate, epoxy cyclo hexahydro di-2-ethylhexyl phthalate, 1,4-butanediol diglycidyl ether), 1,6-hexanediol diglycidyl ether, neopentyl glycol diglycidyl ether, trimethylolpropane triglycidyl ether, polyethylene glycol diglycidyl ether, glycerol triglycidyl ether, polypropylene glycol diglycidyl ether, polyglycidyl ethers of polyether polyol obtained by adding an aliphatic polyol (such as ethylene glycol, propylene glycol, glycerin)) with one or more alkylene oxide, diglycidyl ester of a long-chain aliphatic dicarboxylic acid, monoglycidyl ether of an aliphatic higher alcohol, monoglycidyl ether of polyether alcohol obtained by adding oxyalkylenes (such as phenol, cresol, 4-n-butylphenol), glycidyl ester of higher fatty acid, epoxy butyl oleate, epoxy octyl oleate, epoxidized soybean oil, epoxidized linseed oil, and epoxidized polybutadiene, and the derivative thereof, Celoxide 2021P, CEL3000 (both manufactured by Daicel Chemical Ind., Ltd.).

Examples of the oxolane compound include but are not limited to tetrahydrofuran and 2,3-dimethyl tetrahydrofuran.

Examples of the cyclic acetal compound include but are not limited to trioxane, 1,3-dioxolane and 1,3,6-trioxane cyclooctane.

Examples of the cyclic lactone compound include but are not limited to β-propiolactone and ε-caprolactone.

Examples of the thiirane compound include but are not limited to ethylene sulfide, 1,2-propylene sulfide, and thio epichlorohydrin.

Examples of the thietane compound include but are not limited to 3,3,-dimethyl thietane.

Examples of the vinyl ether compound include but are not limited to ethylene glycol divinyl ether, triethylene glycol divinyl ether, and trimethylolpropane ether.

Examples of the other compound containing the ethylenically unsaturated group include but are not limited to vinyl cyclohexane, isobutylene, and polybutadiene.

Examples of commercialized products of the other cationic polymeric compound (D-2) include but are not limited to TDVE (manufactured by Maruzen Petrochemical), TMPVE (manufactured by Nippon Carbide Industries Co., Inc), UVR- 6100, UVR-6105, UVR-6110, UVR-6128, UVR-6200, UVR-6216 (all manufactured by Union Carbide), Celoxide 2021, Celoxide 2081, Celoxide 2083, Celoxide 2085, EPOLEAD GT-300, EPOLEAD GT-301, EPOLEAD GT-302, EPOLEAD GT-400, EPOLEAD GT-401, EPOLEAD GT-403 (all manufactured by Daicel Chemical Ind., Ltd), KRM-2100, KRM-2110, KRM-2199, KRM-2200, KRM-2400, KRM-2408, KRM-2410, KRM-2490, KRM-2720, KRM-2750 (all manufactured by ADEKA Co., Ltd), Rapi-cure DVE-3, CHVE, PEPC (all manufactured by ISP Ltd), EPICOAT 812, EPICOAT 828, EPICOAT 872, EPICOAT 1031, EPICOAT CT508 (all manufactured by Nippon Epoxy Resin Co.), VECOMER 2010, VECOMER 2020, VECOMER4010, VECOMER 4020 (all manufactured by Allied Signal).

In one embodiment of the present invention, based on 100 parts by weight of the total used amount of the alkali-soluble resin (C), the used amount of the compound (D-1) containing an oxetanyl group is from 20 parts by weight to 200 parts by weight; preferably 25 parts by weight to 180 parts by weight; more preferably 30 parts by weight to 150 parts by weight.

The cationic photoinitiator (E) according to the invention is a photoinitiator that produces an active substance under radiation rays such as visible light, ultraviolet, X-rays, α-rays, β-rays, and γ-rays to make the cationic polymeric compound (D) according to the invention carrying out a polymerization. In one preferred embodiment of the invention, the cationic photoinitiator (E) is an onium salt of Formula (II). The onium salt releases a Louis acid under radiation rays.

$$[R^{51}_xR^{52}_yR^{53}_zR^{54}_uW]^{+p}A(-p) \qquad \text{Formula (II)}$$

wherein:
W represents an element constituting an onium cation;
$R^{51}$, $R^{52}$, $R^{53}$, and $R^{54}$ independently represents a monovalent organic group; or two or more than two of $R^{51}$, $R^{52}$, $R^{53}$, and $R^{54}$ form a ring with W, and others independently represent a monovalent organic group;
x, y, z and u independently represents an integer from 0 to 3 and (x+y+z+u) is equal to the valence of W;
A(-p) represents p valence of an onium anion; and
p is equal to a charge number of the onium cation and onium anion.

In one embodiment of the invention, the element W in Formula (II) is O, S, Se, Te, P, As, Sb, Bi, I, Br, Cl, or —N=N.

Preferably, the onium anion A(-p) in Formula (II) is $[YZ_{v+p}]^{-P}$; wherein Y represents a metal or metal-like atom of a center of a halide complex $[YZ_{v+p}]$; Z represents a halide atom; v represents an atom valence of Y; p is equal to a charge number of the onium anion.

In the onium anion $[YZ_{v+p}]^{-p}$, examples of the metal or metal-like atom are B, P, As, Sb, Fe, Sn, Bi, Al, Ca, In, Ti, Zn, Sc, V, Cr, Mn, or Co.

Examples of the halide Z are F, Cl, Br, or I.

In one preferred embodiment of the invention, $[YZ_{v+p}]^{-p}$ is $BF_4^-$, $PF_6^-$, $SbF_6^-$, $AsF_6^-$, or $SbC_{16}^-$.

In another embodiment of the invention, the onium anion A(-p) in Formula (II) is $[YZ_v(OH)]^-$; wherein Y represents a metal or metal-like atom of a center of a halide complex $[Y_v(OH)]^-$; Z represents halide; v represents an atom valence of Y; p is equal to a charge number of the onium anion. Examples of $[YZ_v(OH)]^-$ are trifluoromethanesulfonate ion $(CF_3SO_3^-)$, fluoro-sulfonic acid ion $(FSO_3^-)$, perchlorate ion $(ClO_4^-)$, p-toluenesulfonate ion, trinitrobenzene sulfonate ion, or trinitrotoluene sulfonate ion.

The onium salt according to the invention is preferably an aromatic onium salt. Examples are aromatic halide onium salt, aromatic halide onium salt of VIA of the periodic table, aromatic halide onium salt of VA of the periodic table oxo sulfoxonium salt, aromatic diazonium salt, or thiopyrylium salt.

In addition, an iron/allene complex or aluminum complexes/photolysis initiator can be used as the cationic photoinitiator (E) according to the invention.

Examples of the commercialized cationic photoinitiator (E) are Adekaoptomer SP-150, Adekaoptomer SP-151, Adekaoptomer SP-152, Adekaoptomer SP-170, Adekaoptomer SP-172 (manufactured by ADEKA Co., Ltd), UVI-6950, UVI-6970, UVI-6974, UVI-6990 (all manufactured by Union Carbide Co.), Irgacure 250, Irgacure 261 (all manufactured by Ciba Specialty Chemicals), CI-2064, CI-2481, CI-2624, CI-2639 (all manufactured by Nippon Soda Co., Ltd.), CD-1010, CD-1011, CD-1012 (all manufactured by Sartomer Inc.), DTS-102, DTS-103, NAT-103, NDS-103, TPS-103, MDS-103, MPI-103, BBI-103 (all manufactured by Midori Kagaku Co., Ltd), PCI-020T, PCI-022T, PCI-061T, PCI-062T (all manufactured by Nippon Kayaku Co., Ltd.), CPI-110A (manufactured by SAN-APRO Co.).

Preferably, examples of the commercialized cationic photoinitiator (E) are Adekaoptomer SP-152, Adekaoptomer SP-170, Adekaoptomer SP-172, UVI-6970, UVI-6974, Irgacure 250, CD-1012, MPI-103, and CPI-110A.

Based on 100 parts by weight of the total used amount of the alkali-soluble resin (C), the used amount of the cationic photoinitiator (E) is from 5 to 50 parts by weight; preferably from 6 to 45 parts by weight; more preferably from 7 to 40 parts by weight.

Examples of the cationic photoinitiator (E) can be used alone or in combinations.

If the cationic photoinitiator (E) is absent, the developing-resistance and ageing stability of sensitivity are poor.

The blue photosensitive resin composition of this invention is prepared by dissolving all the above components other than the organic pigment (A) in the organic solvent (F) to prepare a liquid composition followed by homogeneously mixing the liquid composition with the organic pigment (A). The solvent (F) must be able to dissolve the dye (B), alkali-soluble resin (C), cationic polymeric compound (D), and cationic photoinitiator (E). Also, the organic solvent (F) must not be able to react with the components dissolved therein, and has the proper volatility.

In one embodiment of the invention, based on 100 parts by weight of the total used amount of the alkali-soluble resin (C), the used amount of the organic solvent (F) is from 500 to 5000 parts by weight; preferably from 800 to 4500 parts by weight; more preferably from 1000 to 4000 parts by weight.

The organic solvent (F) suitable for preparing the blue photosensitive resin composition can be selected from the examples of the solvent for preparing the alkali-soluble resin (C). Preferably, the solvent (F) suitable for preparing the blue photosensitive resin composition is selected from propylene glycol methyl ether acetate and ethyl 3-ethoxypropionate.

In one preferred embodiment of the invention, the blue photosensitive resin composition for the color filter further comprises a compound having an ethylenically unsaturated group (G).

The compound having the ethylenically unsaturated group (G) refers to an unsaturated compound containing at least one ethylenically unsaturated group. Examples of the compound containing one ethylenically unsaturated group can be used alone or in admixture of two or more thereof, and include, but are not limited to, acrylamide, acryloylmorpholine, methylacryloylmorpholine, 7-amino-3,7-dimethyloctyl acrylate, 7-amino-3,7-dimethyloctyl methylacrylate, iso-butoxymethyl acrylamide, iso-butoxymethyl methylacrylamide, iso-bornyloxyethyl acrylate, iso-bornyloxyethyl methylacrylate, iso-bornyl acrylate, iso-bornyl methylacrylate, 2-ethylhexyl acrylate, 2-ethylhexyl methylacrylate, ethyl diethylene glycol acrylate, ethyl diethylene glycol methylacrylate, t-octyl acrylamide, t-octyl methylacrylamide, diacetone acrylamide, diacetone methylacrylamide, dimethylaminoethyl acrylate, dimethylaminoethyl methylacrylate, dodecyl acrylate, dodecyl methylacrylate, dicyclopentenyloxyethyl acrylate, dicyclopentenyloxyethyl methylacrylate, dicyclopentenyl acrylate, dicyclopentenyl methylacrylate, N,N-dimethyl acrylamide, N,N-dimethyl methylacrylamide, tetrachlorophenyl acrylate, tetrachlorophenyl methylacrylate, 2-tetrachlorophenoxy ethyl acrylate, 2-tetrachlorophenoxy ethyl methylacrylate, tetrahydrofurfuryl acrylate, tetrahydrofurfuryl methylacrylate, tetrabromophenyl acrylate, tetrabromophenyl methylacrylate, 2-tetrabromophenoxyethyl acrylate, 2-tetrabromophenoxyethyl methylacrylate, 2-trichlorophenoxyethyl acrylate, 2-trichlorophenoxyethyl methylacrylate, tribromophenyl acrylate, tribromophenyl methylacrylate, 2-tribromophenoxyethyl acrylate, 2-tribromophenoxyethyl methylacrylate, 2-hydroxyethyl acrylate, 2-hydroxyethyl methacrylate, 2-hydroxypropyl acrylate, 2-hydroxypropyl methylacrylate, vinylcaprolactam, N-vinylpyrrolidone, phenoxyethyl acrylate, phenoxyethyl methylacrylate, pentachlorophenyl acrylate, pentachlorophenyl methylacrylate, pentabromophenyl acrylate, pentabromophenyl methylacrylate, polyethylene glycol monoacrylate, polyethylene glycol monomethylacrylate, polypropylene glycol monoacrylate, polypropylene glycol monomethylacrylate, bornyl acrylate, and bornyl methylacrylate.

Examples of the compound containing two or more ethylenically unsaturated groups can be used alone or in admixture of two or more thereof, and include, but are not limited to, ethylene glycol diacrylate, ethylene glycol dimethylacrylate, dicyclopentenyl diacrylate, dicyclopentenyl dimethylacrylate, triethylene glycol diacrylate, tetraethylene glycol diacrylate, tetraethylene glycol dimethylacrylate, tri(2-hydroxyethyl) isocyanate diacrylate, tri(2-hydroxyethyl) isocyanate dimethylacrylate, tri(2-hydroxyethyl) isocyanate triacrylate, tri(2-hydroxyethyl) isocyanate trimethylacrylate, caprolactone-modified tri(2-hydroxyethyl) isocyanate triacrylate, caprolactone-modified tri(2-hydroxyethyl) isocyanate trimethylacrylate, trimethylolpropyl triacrylate, trimethylolpropyl trimethylacrylate, ethylene oxide (hereinafter abbreviated as EO) modified trimethylolpropyl triacrylate, EO-modified trimethylolpropyl trimethylacrylate, propylene oxide (hereinafter abbreviated as PO) modified trimethylolpropyl triacrylate, PO-modified trimethylolpropyl trimethylacrylate, tripropylene glycol diacrylate, tripropylene glycol dimethylacrylate, neo-pentyl glycol diacrylate, neo-pentyl glycol dimethylacrylate, 1,4-butanediol diacrylate, 1,4-butanediol dimethylacrylate, 1,6-hexanediol diacrylate, 1,6-hexanediol dimethylacrylate, pentaerythritol triacrylate, pentaerythritol trimethylacrylate, pentaerythritol tetraacrylate, pentaerythritol tetramethylacrylate, polyester diacrylate, polyester dimethylacrylate, polyethylene glycol diacrylate, polyethylene glycol dimethylacrylate, dipentaerythritol hexaacrylate, dipentaerythritol hexamethylacrylate, dipentaerythritol pentaacrylate, dipentaerythritol pentamethylacrylate, dipentaerythritol tetraacrylate, dipentaerythritol tetramethylacrylate, caprolactone-modified dipentaerythritol hexaacrylate, caprolactone-modified dipentaerythritol hexamethylacrylate, caprolactone-modified dipentaerythritol pentaacrylate, caprolactone-modified dipentaerythritol pentamethylacrylate, ditrimethylolpropyl tetraacrylate, ditrimethylolpropyl tetramethylacrylate, EO-modified bisphenol A diacrylate, EO-modified bisphenol A dimethylacrylate, PO-modified bisphenol A diacrylate, PO-modified bisphenol A dimethylacrylate, EO-modified hydrogenated bisphenol A diacrylate, EO-modified hydrogenated bisphenol A dimethylacrylate, PO-modified hydrogenated bisphenol A diacrylate, PO-modified hydrogenated bisphenol A dimethylacrylate, PO-modified glycerol triacrylate, EO-modified bisphenol F diacrylate, EO-modified bisphenol F dimethylacrylate, phenol novolac polyglycidyl ether acrylate, phenol novolac polyglycidyl ether methylacrylate, and TO-1382 (manufactured by Toagosei Company).

Preferably, the compound containing the ethylenic ally unsaturated group (G) is selected from trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate, and combinations thereof.

Preferably, based on 100 parts by weight of the total used amount of the alkali-soluble resin (C), the used amount of the compound containing the ethylenically unsaturated group (G) is from 30 to 300 parts by weight; preferably from 40 to 270 parts by weight; more preferably from 50 to 250 parts by weight.

In one preferred embodiment of the invention, the blue photosensitive resin composition for the color filter further comprises a free-radical photoinitiator (H).

Examples of the free-radical photoinitiator (H) can be used alone or in admixture of two or more thereof, and include, but are not limited to, O-acyloxime compounds, triazine compounds, acetophenone compounds, biimidazole compounds, and benzophenone compounds. Preferably, based on 100 parts by weight of the total used amount of the alkali-soluble resin (C), the used amount of the free-radical photoinitiator (H) is from 10 to 100 parts by weight; preferably from 15 to 90 parts by weight; more preferably from 20 to 80 parts by weight.

Examples of the O-acyloxime compounds can be used alone or in admixture of two or more thereof, and include, but are not limited to, 1-[4-(phenylthio)phenyl]-heptane-1,2-dione 2-O-benzoyloxime), 1-[4-(phenylthio)phenyl]-octane-1,2-dione 2-O-benzoyloxime), 1-[4-(benzoyl)phenyl]-heptane-1,2-dione 2-O-benzoyloxime), 1-[9-ethyl-6-(2-methylbenzoyl)-9H-carbazol-3-yl]-ethylketo 1-O-acetyloxime), 1-[9-ethyl-6-(3-methylbenzoyl)-9H-carbazol-3-yl]-ethylketo 1-O-acetyloxime), 1-[9-ethyl-6-benzoyl-9H-carbazol-3-yl]-ethylketo 1-(O-acetyloxime), ethylketo-1-[9-ethyl-6-(2-methyl-4-tetrahydrofurylbenzoyl)-9H-carbazol-3-yl]-1-(O-acetyloxime), ethylketo-1-[9-ethyl-6-(2-methyl-5-tetrahydropyranylbenzoyl)-9H-carbazol-3-yl]-1-(O-acetyloxime), ethylketo-1-[9-ethyl-6-(2-methyl-4-tetrahydrofurylmethoxybenzoyl)-9H-carbazol-3-yl]-1-O-acetyloxime), ethylketo-1-[9-ethyl-6-(2-methyl-5-tetrahydrofurylmethoxybenzoyl)-9H-carbazol-3-yl]-1-O-acetyloxime), ethylketo-1-[9-ethyl-6-{2-methyl-4-(2,2-dimethyl-1,3-dioxolyl)benzoyl}-9H-carbazol-3-yl]-1-(O-acetyloxime), and ethylketo-1-[9-ethyl-6-{2-methyl-4-(2,2-dimethyl-1,3-dioxolyl)methoxybenzoyl}-9H-carbazol-3-yl]-1-O-acetyloxime).

Examples of the triazine compounds can be used alone or in admixture of two or more thereof, and include, but are not limited to, 2,4-bis(trichloromethyl)-6-(p-methoxy)styryl-s-triazine, 2,4-bis(trichloromethyl)-6-(1-p-dimethylaminophenyl-1,3-butadienyl)-s-triazine, and 2-trichloromethyl-4-amino-6-(p-methoxy)styryl-s-triazine.

Examples of the acetophenone compounds can be used alone or in admixture of two or more thereof, and include, but are not limited to, p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, and 2-benzyl-2-N,N-dimethylamino-1-(4-morpholinophenyl)-1-butanone.

Examples of the biimidazole compounds can be used alone or in admixture of two or more thereof, and include, but are not limited to, 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, and 2,2'-bis(2,4-dichlorophenyl)-4,4',5,5'-tetraphenylbiimidazole.

Examples of the benzophenone compounds can be used alone or in admixture of two or more thereof, and include, but are not limited to, thioxanthone, 2,4-diethylthioxanthone, thioxanthone-4-sulfone, benzophenone, 4,4'-bis(dimethylamino)benzophenone, and 4,4'-bis(diethylamino)benzophenone.

Preferably, the free-radical photoinitiator (H) is selected from 1-[4-(phenylthio)phenyl]-octane-1,2-dione 2-(O-benzoyloxime), 1-[9-ethyl-6-(2-methylbenzoyl)-9H-carbazol-3-yl]-ethylketo 1-O-acetyloxime), ethylketo-1-[9-ethyl-6-(2-methyl-4-tetrahydrofurylmethoxybenzoyl)-9H-carbazol-3-yl]-1-O-acetyloxime), ethylketo-1-[9-ethyl-6-{2-methyl-4-(2,2-dimethyl-1,3-dioxolyl)methoxybenzoyl}-9H-carbazol-3-yl]-1-O-acetyloxime), 2,4-bis(trichloromethyl)-6-(p-methoxy)styryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, 4,4'-bis(diethylamino)benzophenone, and combinations thereof.

In addition to the aforesaid free-radical photoinitiator (H), other initiators can be further added into the blue photosensitive resin composition according to the present invention provided that the desirable physical properties of the blue photosensitive resin composition are not affected. Examples of the other initiators include α-diketone compounds, acyloin compounds, acyloin ether compounds, acylphosphineoxide compounds, quinine compounds, halide compounds, peroxide compounds, or the like.

Examples of the α-diketone compounds can be used alone or in admixture of two or more thereof, and include, but are not limited to, benzil and acetyl compounds. Examples of the acyloin compounds can be used alone or in admixture of two or more thereof, and one of the examples thereof is benzoin. Examples of the acyloin ether compounds can be used alone or in admixture of two or more thereof, and include, but are limited to, benzoin methylether, benzoin ethylether, and benzoin isopropyl ether.

Examples of the acylphosphine oxide compounds can be used alone or in admixture of two or more thereof, and include, but are not limited to, 2,4,6-trimethylbenzoyl diphenylphosphine oxide, and bis-(2,6-dimethoxybenzoyl)-2,4,4-trimethyl benzyl phosphine oxide. Examples of the quinone compounds can be used alone or in admixture of two or more thereof, and include, but are not limited to, anthraquinone and 1,4-naphthoquinone. Examples of the halide compounds can be used alone or in admixture of two or more thereof, and include, but are not limited to, phenacyl chloride, tribromomethyl phenylsulfone, and tris(trichloromethyl)-s-triazine.

Examples of the peroxide compounds can be used alone or in admixture of two or more thereof, and one of the examples thereof is di-tert-butyl peroxide.

When incorporating the compound containing the ethylenically unsaturated group (G) and free-radical photoinitiator (H), the developing-resistance is improved.

In one preferred embodiment of the invention, the blue photosensitive resin composition of the present invention can contain other functional additives (I), such as fillers, polymers other than the alkali-soluble resin (C), adhesion-promoting agents, antioxidants, UV absorbents, anti-coagulants, or the like so as to provide the blue filter segment made from the blue photosensitive resin composition with specifically required physical and chemical properties.

The aforementioned examples of the functional additives (I) can be used alone or in admixture of two or more thereof. Examples of the fillers include glass, aluminum, or the like. Examples of the polymers other than the alkali-soluble resin (C) include polyvinyl alcohol, polyethylene glycol monoalkyl ether, polyfluoro alkyl acrylate, or the like. Examples of the adhesion-promoting agents include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, or the like. Examples of the antioxidants include 2,2-thiobis(4-methyl-6-t-butylphenol), 2,6-di-t-butylphenol, or the like. Examples of the UV absorbents include 2-(3-t-butyl-5-methyl-2-hydroxyphenyl)-5-chlorobenzotriazole, alkoxybenzophenone, or the like. Examples of the anti-coagulants include sodium polyacrylate, or the like.

The present invention also provides a method for manufacturing a color filter comprising forming a pixel layer with the blue photosensitive resin composition for a color filter as mentioned above.

The present invention also provides a color filter manufactured by the method as mentioned above.

Preferably, the color filter comprises a pixel layer formed by the blue photosensitive resin composition for a color filter.

The manner for manufacturing the color filter by applying the blue photosensitive resin composition for the color filter according to the invention can be coated on a substrate by a spin coating method, a cast coating method, an ink-jet method, a roller coating method, or the like, and is then dried under a reduced pressure to remove most of the solvent. After completely evaporating the residual solvent by pre-baking, a coating film is formed. Operation conditions for the drying under the reduced pressure and the pre-baking depend on kinds and amounts of the components used in the photosensitive resin composition. In general, the drying under the reduced pressure is carried out at a pressure from 0 to 200 mm Hg for a period from 1 to 60 seconds. The pre-baking is carried out at a temperature from 70° C. to 110° C. for a period from 1 to 15 minutes. The coating film is then exposed to UV light with a specific photo mask, and is developed in a developer solution at a temperature of 23±2° C. for a period from 15 seconds to 5 minutes to dissolve and remove the unexposed portions of the coating film so as to obtain a desired pattern. Preferably, the UV light used for the exposure of the coating film can be g line, h line, i line, or the like. The UV lamp for providing the UV light is a (ultra)high-pressure mercury lamp or a metal halide lamp.

The substrate used to form the color filter is made from bare glass, soda glass, pyrex glass, or silica glass, and the glass is coated with a transparent conductive film, or a transparent electrode substrate is used in a solid state image pick up device. A black matrix is formed on the substrate to separate each color pixel element.

The alkali developer is preferably an aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diazabicyclo(5,4,0)-7-undecene, and the like. The concentration of alkali developer is 0.001 wt % to 10 wt %, preferably 0.005 wt % to 5 wt %, and more preferably 0.01 wt % to 1wt %.

After developing with the developer solution, the resulting pattern is sufficiently washed with water and dried with compressed air or compressed nitrogen.

Finally, it is baked with a heating device such as a hot plate or an oven at 100° C. to 280° C. for 1 to 15 minutes to remove the volatile components of the coating film, and to undergo a thermal reaction with the unreacted ethylenically unsaturated double bonds in the coating film. By repeating the above procedures for photosensitive resin composition comprising red, green and blue pigment dispersed therein, a color filter having arrays of red, green and blue pixels arranged on the substrate is obtained.

Moreover, the ITO electrode film can be formed on the color pixels using a sputtering procedure at 220° C. to 250° C., which can be etched and patterned according to needs. Then, a polyimide polymer is coated on the ITO electrode film to form an alignment layer, and the color filter for LCD is obtained.

The present invention further provides a liquid crystal display device comprising the color filter as mentioned above.

According to the liquid crystal display device, a color filter substrate obtained as mentioned above and a driver substrate with a thin film transistor (TFT) substrate are disposed oppositely, and a cell gap is disposed therebetween, and the two substrates are sealed with a sealing agent around the sites of the two substrates. Liquid crystals are then injected into the space defined by the surfaces of the substrates and the sealing agent, and the inject hole is further sealed to form a liquid crystal cell. Then, a polarizer is adhered on the outer surface of the liquid crystal cell, i.e. on the other side of each substrate constituting the liquid crystal cell, and the liquid crystal display device is obtained.

The following examples are given for the purpose of illustration only and are not intended to limit the scope of the present invention.

Synthesis Example

Preparation of First Alkali-Soluble Resin (C-1)

Synthesis Example (C-1-1)

Preparation of First Alkali-Soluble Resin (C-1-1)

The components comprising 100 parts by weight of the fluorine compound containing the epoxy group (trade name ESF-300, manufactured by Nippon Steel Chemical Co., Ltd.; epoxy equivalent per weight: 231), 30 parts by weight of the acrylic acid, 0.3 parts by weight of the benzyltriethylammonium chloride, 0.1 parts by weight of the 2,6-di-t-butyl-p-cresol and 130 parts by weight of the propylene glycol methyl ether acetate were continuously charged to a 500 mL four-necked conical flask, in a feeding speed of 25 parts by weight per minute under 100° C. to 110° C. to polymerize for 15 hours. After the reaction was completed, a yellowish clear mixed solution with 50 wt % of solid content was obtained.

Next, 100 parts by weight of the resulted yellowish clear mixed solution was dissolved in 25 parts by weight of ethylene glycol monoethyl ether acetate, where 6 parts by weight of tetrahydrophthalic anhydride and 13 parts by weight of benzophenone tetracarboxylic dianhydride (BTDA) were also added thereto, followed by heating the reaction to 110° C. to 115° C. for 2 hours, thereby obtaining the resin containing unsaturated group(s) (C-1-1) with acid value of 98.0 mg KOH/g and averaged molecular weight of 1623.

Synthesis Example (C-1-2)

Preparation of First Alkali-Soluble Resin (C-1-2)

The components comprising 100 parts by weight of the fluorine compound containing the epoxy group (trade name ESF-300, manufactured by Nippon Steel Chemical Co., Ltd.; epoxy equivalent per weight: 231), 30 parts by weight of the acrylic acid, 0.3 parts by weight of the benzyltriethylammonium chloride, 0.1 parts by weight of the 2,6-di-t-butyl-p-cresol and 130 parts by weight of the propylene glycol methyl ether acetate were continuously charged to a 500 mL four-necked conical flask, in a feeding speed of 25 parts by weight per minute under 100° C. to 110° C. to polymerize for 15 hours. After the reaction was completed, a yellowish clear mixed solution with 50 wt % of solid content was obtained.

Next, 100 parts by weight of the resulted yellowish clear mixed solution was dissolved in 25 parts by weight of ethylene glycol monoethyl ether acetate, where 13 parts by weight of tetrahydrophthalic anhydride, for reacting under 90° C. to 95° C. for 2 hours. And then, and 6 parts by weight of tetrahydrophthalic anhydride were added to the above-mentioned reactant, followed by heating the reaction to 90° C. to 95° C. for 4 hours, thereby obtaining the resin containing unsaturated group(s) (C-1-2) with acid value of 99.0 mg KOH/g.

Synthesis Example (C-1-3)

Preparation of First Alkali-Soluble Resin (C-1-3)

The components comprising 400 parts by weight of the epoxy compound (trade name NC-3000, manufactured by Nippon Kayaku Co., Ltd.; epoxy equivalent per weight: 228), 102 parts by weight of the acrylic acid, 0.3 parts by weight of the methoxyphenol, 5 parts by weight of the triphenyl phosphine and 264 parts by weight of the propylene glycol methyl ether acetate were continuously charged to the flask as above-mentioned, for reacting under 95° C. to polymerize for 9 hours. After the reaction was completed, an intermediate product with acid value of 2.2 mg KOH/g was obtained. Next, the resulted intermediate product was added with 151 parts by weight of tetrahydrophthalic anhydride, for reacting under 95° C. for 4 hours, thereby obtaining the resin containing unsaturated group(s) (C-1-3) with acid value of 102 mg KOH/g and averaged molecular weight of 2589.

Synthesis Example

Preparation of Second Alkali-Soluble Resin (C-2)

Synthesis Example (C-2-1)

Preparation of Second Alkali-Soluble Resin (C-2-1)

A 1000 ml four-necked conical flask equipped with a nitrogen inlet, a stirrer, a heater, a condenser and a thermometer was purged with nitrogen, and was added with 45 parts by weight of 2-methacryloylethoxy succinate, 40 parts by weight of styrene, 15 parts by weight of dicyclopentenyloxyethyl acrylate, and 200 parts by weight of ethyl 3-ethoxypropionate. The ingredients were continuously added into the four-necked conical flask with stirring in an oil bath of 100° C. Four parts by weight of 2,2'-azobis-2-methyl butyronitrile was dissolved into ethyl 3-ethoxypropionate, divided equally into four portions, and added into the four-necked conical flask portionwise within an hour. Polymerization was conducted at 100° C. for 6 hours, and a polymerization product was then taken out of the conical flask followed by removal of solvent from the product so as to obtain an alkali-soluble resin (C-2-1).

Synthesis Examples C-2-2 to C-2-4 were conducted in a manner identical to that of Synthesis Example C-2-1 with different reaction conditions as well as altered ingredients and amounts which are illustrated in Table 1.

(hereafter as D-1-1), 5 parts by weight of Adekaoptomer SP-152 (hereafter as E-1), 30 parts by weight of dipentaerythritol hexaacrylate (hereafter as G-1), 10 parts by weight of 2-methyl-1-(4-methylthiophenyl)-2-morpholin-1-propanone (hereafter as H-1) were added into 500 parts by weight of 3-ethoxypropionate (hereafter as F-1) and were mixed and dissolved using a shaker to obtain a blue photosensitive resin composition for a color filter. The obtained blue photosensitive resin composition for a color filter was subjected to assays shown below and the results are shown in Table 2.

Examples 2 to 10 and Comparative Examples 1 to 10

The preparations are similar to that of Example 1 with modifications of the kinds and amounts of the compositions. The compositions and the results of the assays are shown in Tables 2 and 3.

Assays

Contrast:

The examples and the comparative examples of the blue photosensitive resin composition for the color filter were coated on a 100 mm×100 mm glass substrate using a rotation coating method, and decompression drying was first carried out at a pressure of 100 mmHg for 30 seconds, after which pre-bake was implemented at a temperature of 80° C. for 3 minutes, thereby forming a pre-baked coating film of 2.5 µM film thickness. The aforementioned coating film was radiated with UV ray of 300 mJ/cm$^2$ (Canon PLA-501F) and immersed in the developer at 23° C. for 2 minutes. Then, the film was washed with deionized water, and after baking at

TABLE 1

Synthesis Examples of alkali-soluble resin

| Synthesis | Composition (parts by weight) | | | | | | | | | | Copolymerization Condition | | |
|---|---|---|---|---|---|---|---|---|---|---|---|---|---|
| | Monomers for Copolymerization | | | | | | | Initiator | | Solvent | Feeding | Reac. Temp. | Reac. Time |
| Examples | HOMS | MAA | SM | DCPOA | BzMA | PMI | MA | AMBN | ADVN | EEP | manner | (° C.) | (hrs) |
| C-2-1 | 45 | | 40 | 15 | | | | 4 | | 200 | Continuous | 100 | 6 |
| C-2-2 | | 35 | | | 45 | 5 | 15 | 4.5 | | 200 | Continuous | 105 | 6 |
| C-2-3 | 20 | 20 | 20 | | 20 | | 20 | 4 | | 200 | Continuous | 100 | 5.5 |
| C-2-4 | 30 | | 15 | 15 | 20 | | 20 | | 4 | 200 | Continuous | 100 | 6 |

HOMS 2-methacryloyloxyethyl succinate monoester
MAAV methacrylic acid
SM styrene monomer
DCPOA dicyclopentenyloxyethyl acrylate
BzMA benzyl methacrylate
PMI N-phenylmaleimide
MA methyl acrylate
AMBN 2,2'-azobis-2-methyl butyronitrile
ADVN 2,2'-Azobis(2,4-dimethylvaleronitrile)
EEP ethyl 3-ethoxypropionate Example Blue Photosensitive Resin Composition for the Color Filter Examples 1

100 parts by weight of the alkali-soluble resin (C-1-1) prepared according to the above mentioned Synthesis, 20 parts by weight of the organic pigment (A-1-1), 5 parts by weight of the dye (B-1), 20 parts by weight of OXT-101

200° C. for 80 minutes, a photosensitive resin layer with a thickness of 2.0 µM was formed on the glass substrate.

Figure 2:
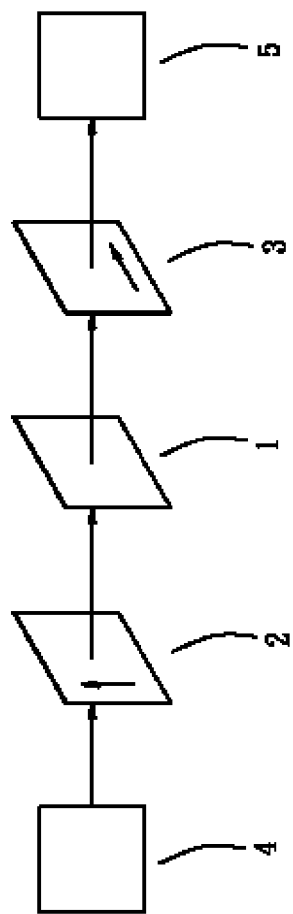
FIG. 2 is a schematic view depicting a contrast measurement state (2) of the photosensitive resin layer.

The brightness of the 2.0 µM photosensitive resin layer obtained was measured by the methods depicted in FIG. 1 and FIG. 2. In which, the photosensitive resin layer (1) obtained was placed between two polarizing filters (2), (3), and the light emanating from a light source (4) was made to sequentially penetrate the polarizing filter (2), the photosensitive resin layer (1), and the polarizing filter (3), the brightness (cd/cm2) finally penetrating the polarizing filter (3) was then measured using a brightness meter (5) (manufactured by Japan Topcon Company, model No. BM-5A).

Referring to FIG. 1, when the polarization direction of the polarizing filter (3) and the polarization direction of the polarizing filter (2) were mutually parallel, then the measured brightness was A (cd/cm$^2$). In addition, referring to FIG. 2 again, when the polarization direction of the polarizing filter (3) and the polarization direction of the polarizing filter (2) were mutually perpendicular, then the measured brightness was B (cd/cm$^2$). Accordingly, the contrast was obtained by using the ratio of brightness A and the brightness B (brightness A/brightness B), the evaluation criteria being as follows:

⊚: 1500≤(brightness $A$/brightness $B$)

○: 1200≤(brightness $A$/brightness $B$)<1500

Δ: 900≤(brightness $A$/brightness $B$)<1200

×: (brightness $A$/brightness $B$)<900

Developing-Resistance:

The examples and the comparative examples of the blue photosensitive resin composition for the color filter were coated on a 100 mm×100 mm glass substrate using a rotation coating method, and decompression drying was first carried out at a pressure of 100 mmHg for 30 seconds, after which pre-bake was implemented at a temperature of 80° C. for 3 minutes, thereby forming a pre-baked coating film of 2.5 μM film thickness. Then, the chromaticity (L*, a*, b*) was measured by the chromometer (Otsuka Electronics Co., Ltd., Model MCPD).

The aforementioned coating film was radiated with UV ray of 100 mJ/cm$^2$ (Canon PLA-501F) and immersed in the developer at 23° C. for 1 minute. Then, the film was washed with deionized water. The chromaticity was measured again. If the resulting change in chromaticity (ΔEab*) is smaller, the developing-resistance is better. The difference of the chromaticity (ΔEab*) was measured as below:

$\Delta Eab^* = \{(\Delta L)^2 + (\Delta a)^2 + (\Delta b)^2\}^{1/2}$

⊚: $\Delta Eab^* < 2$

○: $2 \leq \Delta Eab^* < 4$

Δ: $4 \leq \Delta Eab^* < 6$

□: $6 \leq \Delta Eab^*$

Ageing Stability of Sensitivity:

The resulting blue photosensitive resin composition for a color filter was kept at 45° C. for 3 days. The size difference (ΔCD) of the color pattern of the exposure unit before and after keeping were measured with the scanning electron microscope (manufactured by Hitachi, Ltd, S-9260) (ΔCD=size of the color pattern of the exposure unit before keeping−size of the color pattern of the exposure unit after keeping). The criteria are shown below:

⊚: $\Delta CD \leq 0.02$ μm

○: $0.02$ μm $< \Delta CD \leq 0.05$ μm

Δ: $0.05$ μm $< \Delta CD \leq 0.07$ μm

×: $\Delta CD < 0.07$ μm

Color Reproduction:

The resulting blue photosensitive resin composition for the color filter was applied for manufacturing the color liquid crystal display device according to the method mentioned above.

CIE chromaticity coordinate value of a color liquid crystal display device was determined using the colorimeter. NTSC ratio can be obtained by dividing color gamut of measured CIE chromaticity coordinates by color gamut of standard CIE chromaticity coordinates. A higher NTSC ratio means the better color reproduction.

⊚: NTSC ratio>90%

○: 85%<NTSC ratio≤90%

Δ: 80%<NTSC ratio≤85%

×: NTSC ratio≤80%

TABLE 2

Contents and Assays of Examples of the Blue Photosensitive Resin Composition For the Color Filter

| Components | | | Example 1 | 2 | 3 | 4 | 5 | 6 | 7 | 8 | 9 | 10 |
|---|---|---|---|---|---|---|---|---|---|---|---|---|
| organic pigment (A) (parts by weight) | A-1 | A-1-1 | 20 | | | 100 | | | 20 | | | 100 |
| | | A-1-2 | | 50 | | | 150 | | | 200 | | 50 |
| | | A-1-3 | | | 80 | | | 200 | | | 100 | |
| | A-2 | A-2-1 | | | | 30 | | | 10 | | | |
| | | A-2-2 | | | | 20 | | | | 100 | | |
| dye (B) (parts by weight) | B-1 | Formula (1) | 5 | | | | 20 | | | | 10 | |
| | B-2 | Formula (22) | | 10 | | | 30 | 30 | | | 20 | 20 |
| | B-3 | Formula (28) | | | 20 | | | | 40 | | | 30 |
| | B-4 | Formula (31) | | | | 30 | | | | 50 | | |
| alkali-soluble resin (C) (parts by weight) | C-1 | C-1-1 | 100 | | | 100 | | 50 | 90 | | | 70 |
| | | C-1-2 | | 100 | | | 100 | | | 30 | | |
| | | C-1-3 | | | 100 | | | 50 | | | 50 | |
| | C-2 | C-2-1 | | | | | | | 10 | | | |
| | | C-2-2 | | | | | | | | 70 | | |
| | | C-2-3 | | | | | | | | | 50 | |
| | | C-2-4 | | | | | | | | | | 30 |

TABLE 2-continued

Contents and Assays of Examples of the Blue Photosensitive Resin Composition For the Color Filter

| Components | | | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| cationic polymeric compound (D) (parts by weight) | D-1 | D-1-1 | 20 | | | | | 200 | | | 100 | |
| | | D-1-2 | | 50 | | | | | 100 | | | |
| | | D-1-3 | | | 100 | | | | 100 | 20 | | |
| | | D-1-4 | | | | 150 | | | | 100 | | |
| | D-2 | D-2-1 | | | | | | | | 10 | 50 | |
| | | D-2-2 | | | | | | | | 50 | | 200 |
| cationic photoinitiator (E) (parts by weight) | | E-1 | 5 | | | | 50 | 30 | | | | 10 |
| | | E-2 | | 20 | | | | 20 | 10 | | | 40 |
| | | E-3 | | | 30 | | | | | 15 | 20 | |
| | | E-4 | | | | 40 | | | | | 20 | |
| organic solvent (F) (parts by weight) | | F-1 | 500 | 1000 | 2000 | 3000 | 4000 | 5000 | | 2000 | 3000 | 2000 |
| | | F-2 | | | | | | | 3000 | 3000 | | 2000 |
| compound containing an ethylenically unsaturated group (G) (parts by weight) | | G-1 | 30 | | | | | | 100 | | | |
| | | G-2 | | | | | | | | 150 | | |
| | | G-3 | | | | | | | | 150 | | |
| free-radical photoinitiator (H) (parts by weight) | | H-1 | 10 | | | | | | 30 | 60 | | |
| | | H-2 | | | | | | | | 40 | | |
| | | H-3 | | | | | | | 20 | | | |
| functional additives (I) (parts by weight) | | I-1 | | | | | 1 | | | | | |
| | | I-2 | | | | | | | | | | 5 |
| Assays | | Contrast | ◎ | ◎ | ◎ | ◎ | ◎ | ◎ | ◎ | ◎ | ◎ | ◎ |
| | | Color Reproduction | ◎ | ◎ | ○ | ◎ | ◎ | ○ | ◎ | ◎ | ○ | ◎ |
| | | Ageing Stability of Sensitivity | ◎ | ◎ | ◎ | ◎ | ◎ | ◎ | ◎ | ◎ | ◎ | ○ |
| | | Developing-Resistance | ◎ | ◎ | ◎ | ◎ | ◎ | ◎ | ◎ | ◎ | ◎ | ◎ |

TABLE 3

Comparative Examples of the Blue Photosensitive Resin Composition

| Components | | | Comparative Examples 1 | 2 | 3 | 4 | 5 | 6 | 7 | 8 | 9 | 10 |
|---|---|---|---|---|---|---|---|---|---|---|---|---|
| organic pigment (A) (parts by weight) | A-1 | A-1-1 | | 100 | 100 | | | | | | | |
| | | A-1-2 | | | | 150 | | | | | | |
| | | A-1-3 | | | | | 200 | | | | | |
| | A-2 | A-2-1 | | | | | | | | | | |
| | | A-2-2 | | | | | | | | | | |
| dye (B) (parts by weight) | B-1 | Formula (1) | 50 | | | | | | 50 | | | |
| | B-2 | Formula (22) | | | 50 | | | 50 | | 40 | | |
| | B-3 | Formula (28) | | | | 40 | | | | | 40 | |
| | B-4 | Formula (31) | | | | | 30 | | | | | 50 |
| alkali-soluble resin (C) (parts by weight) | C-1 | C-1-1 | 100 | | | | 100 | | | | | |
| | | C-1-2 | | 100 | | | | | 100 | | | |
| | | C-1-3 | | | 100 | | | | | 100 | | |
| | C-2 | C-2-1 | | | | 100 | | | | | | |
| | | C-2-2 | | | | | | 100 | | | | |
| | | C-2-3 | | | | | | | | | 100 | |
| | | C-2-4 | | | | | | | | | | 100 |

TABLE 3-continued

Comparative Examples of the Blue Photosensitive Resin Composition

| Component | | | C.Ex.1 | C.Ex.2 | C.Ex.3 | C.Ex.4 | C.Ex.5 | C.Ex.6 | C.Ex.7 | C.Ex.8 | C.Ex.9 | C.Ex.10 |
|---|---|---|---|---|---|---|---|---|---|---|---|---|
| cationic polymeric compound (D) (parts by weight) | D-1 | D-1-1 | 30 | | | | | | | | | |
| | | D-1-2 | | 40 | | | | | | | | |
| | | D-1-3 | | | 50 | 60 | | | | | | 70 |
| | | D-1-4 | | | | | | 70 | 80 | | | |
| | D-2 | D-2-1 | | | | | | | | | | |
| | | D-2-2 | | | | | | | | | | |
| cationic photoinitiator (E) (parts by weight) | | E-1 | 10 | | | | | | 10 | | | |
| | | E-2 | | 20 | | | | 10 | | 20 | | |
| | | E-3 | | | 30 | 30 | | | | | | |
| | | E-4 | | | | | | | | | | |
| organic solvent (F) (parts by weight) | | F-1 | 500 | | 2000 | 2000 | 500 | | 500 | | 500 | |
| | | F-2 | | 1000 | | | 2000 | 500 | | 500 | | 500 |
| compound containing an ethylenically unsaturated group (G) (parts by weight) | | G-1 | | | | | | | | | | |
| | | G-2 | | | | | | | | | | |
| | | G-3 | | | | | | | | | | |
| free-radical photoinitiator (H) (parts by weight) | | H-1 | | | | | | | | | | |
| | | H-2 | | | | | | | | | | |
| | | H-3 | | | | | | | | | | |
| functional additives (I) (parts by weight) | | I-1 | | | | | | | | | | |
| | | I-2 | | | | | | | | | | |
| Assays | | Contrast | ○ | X | ○ | ○ | ○ | ○ | ○ | ○ | ○ | ○ |
| | | Color Reproduction | X | ○ | ○ | ○ | ○ | X | X | X | X | X |
| | | Ageing Stability of Sensitivity | ○ | ○ | ○ | X | X | ○ | X | X | X | X |
| | | Developing-Resistance | ○ | ○ | Δ | Δ | Δ | Δ | Δ | Δ | X | X |

| | | | Comparative Examples | | | | | | | | |
|---|---|---|---|---|---|---|---|---|---|---|---|
| Components | | | 11 | 12 | 13 | 14 | 15 | 16 | 17 | 18 | 19 |
| organic pigment (A) (parts by weight) | A-1 | A-1-1 | | | | | 100 | | | | |
| | | A-1-2 | | | 100 | | | 150 | | 150 | 150 |
| | | A-1-3 | | | | | | | 200 | | 200 |
| | A-2 | A-2-1 | | | | | | | | | |
| | | A-2-2 | | | | | | | | | |
| dye (B) (parts by weight) | B-1 | Formula (1) | | | | | | | | | |
| | B-2 | Formula (22) | | | 40 | | | | | | |
| | B-3 | Formula (28) | 30 | | | | | | | | |
| | B-4 | Formula (31) | | | | | | | | | |
| alkali-soluble resin (C) (parts by weight) | C-1 | C-1-1 | 100 | | | | | | | 100 | |
| | | C-1-2 | | | | 100 | | | | | |
| | | C-1-3 | | | | | 100 | | | | |
| | C-2 | C-2-1 | | 100 | | | | | | | 100 |
| | | C-2-2 | | | 100 | | | | | | |
| | | C-2-3 | | | | | | | 100 | | |
| | | C-2-4 | | | | | | | | 100 | |
| cationic polymeric compound (D) (parts by weight) | D-1 | D-1-1 | | | | | 50 | | | | |
| | | D-1-2 | | | 60 | | | | | 60 | |
| | | D-1-3 | | | | | | | | | |
| | | D-1-4 | | | | | | | | | |
| | D-2 | D-2-1 | | | | | 50 | | | | |
| | | D-2-2 | | | | | | | | | |

TABLE 3-continued

Comparative Examples of the Blue Photosensitive Resin Composition

| component | sub | C1 | C2 | C3 | C4 | C5 | C6 | C7 | C8 | C9 |
|---|---|---|---|---|---|---|---|---|---|---|
| cationic photoinitiator (E) (parts by weight) | E-1 | | | | | | | | | |
| | E-2 | | | | | | | | | |
| | E-3 | | | 30 | | 50 | | | | |
| | E-4 | | | | 40 | | | | | |
| organic solvent (F) (parts by weight) | F-1 | 500 | | 1000 | | 2000 | | 2000 | 500 | 500 |
| | F-2 | | 500 | | 1000 | | 2000 | | 2000 | 2000 |
| compound containing an ethylenically unsaturated group (G) (parts by weight) | G-1 | 100 | | | | | | | 200 | 200 |
| | G-2 | | 100 | | | | | | | |
| | G-3 | | | | | | | | | |
| free-radical photoinitiator (H) (parts by weight) | H-1 | 20 | 20 | | | | | | 30 | 30 |
| | H-2 | | | | | | | | 20 | |
| | H-3 | | | | | | | | | 20 |
| functional additives (I) (parts by weight) | I-1 | | | | | | | | | |
| | I-2 | | | | | | | | | |
| Assays | Contrast | ○ | ○ | X | X | X | X | X | X | X |
| | Color Reproduction | X | X | ○ | ○ | ○ | ○ | ○ | ○ | ○ |
| | Ageing Stability of Sensitivity | X | X | ○ | X | X | X | X | X | X |
| | Developing-Resistance | Δ | X | Δ | Δ | Δ | X | X | Δ | X |

In Tables 2 and 3:
A-1-1 C.I Pigment Blue 15:4
A-1-2 C.I Pigment Blue 15:6
A-2-1 C.I Pigment Violet 19
A-2-2 C.I Pigment Violet 23
A-3-1 C.I Pigment Blue 60
B-1 Formula (1)
B-2 Formula (22)
B-3 Formula (28)
B-4 Formula (31)
D-1-1 OXT-101 (manufactured by Toagosei Co., Ltd)
D-1-2 OXT-121 (manufactured by Toagosei Co., Ltd)
D-1-3 OXT-213 (manufactured by Toagosei Co., Ltd)
D-1-4 OXT-221 (manufactured by Toagosei Co., Ltd)
D-2-1 TDVE (manufactured by Maruzen Petrochemical)
D-2-2 TMPVE (manufactured by Nippon Carbide Industries Co., Inc)
E-1 Adekaoptomer SP-152 (manufactured by ADEKA Co., Ltd)
E-2 Irgacure 261 (manufactured by Ciba Specialty Chemicals)
E-3 UVI-6974 (manufactured by Union Carbide Co., Ltd)
E-4 PCI-062T (manufactured by Nippon Kayaku Co., Ltd)
F-1 3-ethoxypropionate
F-2 propylene glycol methyl ether acetate
G-1 dipentaerythritol hexaacrylate (manufactured by Toagosei Co., Ltd)
G-2 trimethylolpropyl triacrylate
G-3 TO-1382 (manufactured by Toagosei Company)
H-1 2-methyl-1-(4-methylthiophenyl)-2-morpholin-1-propanone
H-2 2,2'-bis(2,4-dichlorophenyl)-4,4',5,5'-tetraphenylbiimidazole
H-3 4,4'-bis(diethylamino)benzophenone
I-1 3-mercaptopropyltrimethoxysilane
I-2 2,2-thiobis(4-methyl-6-t-butylphenol)

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:
1. A blue photosensitive resin composition for a color filter comprising:
an organic pigment (A);
a dye (B);
an alkali-soluble resin (C);
a cationic polymeric compound (D);
a cationic photoinitiator (E); and
an organic solvent (F);
wherein
the dye (B) comprises a red dye represented by Formula (I):

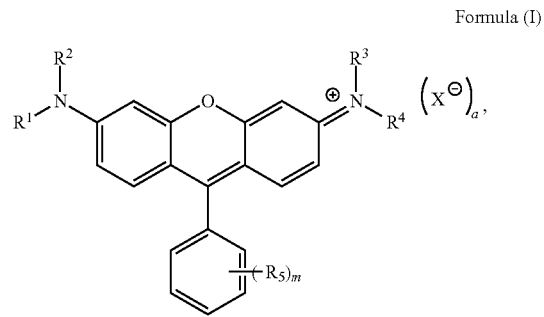

Formula (I)

in Formula (I):

$R^1$, $R^2$, $R^3$, and $R^4$ are independently selected from the group consisting of hydrogen, —$R^6$, and a $C_6$-$C_{10}$ aryl group unsubstituted or substituted with a substituent selected from the group consisting of a halogen atom, —$R^6$, —OH, —$OR^6$, —$SO_3^-$, —$SO_3H$, —$SO_3M$, —COOH, —$COOR^6$, —$SO_3R^6$, —$SO_2NHR^8$, and —$SO_2NR^8R^9$;

$R^5$ is selected from the group consisting of —$SO_3^-$, —$SO_3H$, —$SO_3M$, —COOH, —$COOR^6$, —$SO_3R^6$, —$SO_2NHR^8$, and —$SO_2NR^8R^9$;

m is an integer ranging from 0 to 5; when m is from 2 to 5, a plurality of $R^5$ is the same or different;

X represents a halogen atom;

a is 0 or 1;

$R^6$ is a $C_1$-$C_{10}$ alkyl group unsubstituted or substituted with a halogen atom; wherein —$CH_2$— contained in said $C_1$-$C_{10}$ alkyl group is un-replaced or replaced with —O—, carbonyl, or —$NR^7$—;

$R^7$ is a $C_1$-$C_{10}$ alkyl group unsubstituted or substituted with a halogen atom;

$R^8$ and $R^9$ are independently selected from the group consisting of a $C_1$-$C_{10}$ linear alkyl group, a $C_1$-$C_{10}$ branched chain alkyl group, a $C_3$-$C_{30}$ cycloalkyl group, and -Q; wherein a hydrogen atom in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —OH, a halogen atom, -Q, —$CH=CH_2$, and —CH=CH—$R^6$; and a —$CH_2$— in the $C_1$-$C_{10}$ linear alkyl group, $C_1$-$C_{10}$ branched chain alkyl group, or $C_3$-$C_{30}$ cycloalkyl group is unsubstituted or substituted with a substituent selected from the group consisting of —O—, carbonyl, and —$NR^7$—; or $R^8$ and $R^9$ join together to form a $C_1$-$C_{10}$ heterocyclic group; wherein a hydrogen atom in the $C_1$-$C_{10}$ heterocyclic group is unsubstituted or substituted with a substituent selected from the group consisting of $R^6$, —OH and -Q;

Q is selected from the group consisting of a $C_6$-$C_{10}$ aryl group, a $C_5$-$C_{10}$ heteroaryl group, a $C_6$-$C_{10}$ aryl group substituted with a substituent selected from the group consisting of a halogen atom, —$R^6$, —OH, —$OR^6$, —$NO_2$, —$CH=CH_2$, and —CH=CH—$R^6$, and a $C_5$-$C_{10}$ heteroaryl group substituted with a substituent selected from the group consisting of halogen, —$R^6$, —OH, —$OR^6$, —$NO_2$, —$CH=CH_2$, and —CH=CH—$R^6$; and M represents potassium or sodium;

the alkali-soluble resin (C) comprises a first alkali-soluble resin (C-1), and the first alkali-soluble resin (C-1) is obtained by polymerizing a mixture comprising an epoxy compound (i) containing at least two epoxy groups, and a compound (ii) containing at least one carboxylic acid group and at least one ethylenically unsaturated group; and the cationic polymeric compound (D) comprises a compound (D-1) containing an oxetanyl group.

2. The blue photosensitive resin composition for the color filter according to claim 1, wherein the epoxy compound (i) containing at least two epoxy groups comprises a structure represented by Formula (C-I) or Formula (C-II):

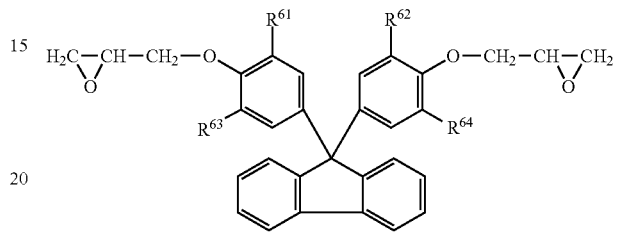

Formula (C-I)

in Formula (C-I), $R^{61}$, $R^{62}$, $R^{63}$, and $R^{64}$ are the same or different from each other; each of which independently represents a hydrogen atom, a halogen atom, a $C_1$-$C_5$ alkyl group, a $C_1$-$C_5$ alkoxy group, a $C_6$-$C_{12}$ aryl group or a $C_6$-$C_{12}$ aromatic alkyl group;

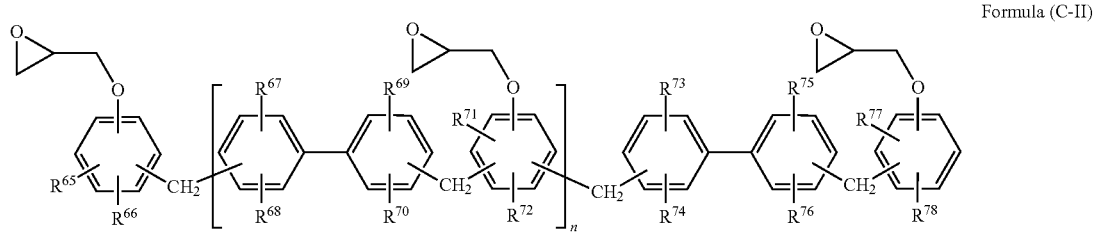

Formula (C-II)

in Formula (C-II), $R^{65}$ to $R^{78}$ are the same or different from each other; each of which independently represents a hydrogen atom, a halogen atom, a $C_1$-$C_8$ alkyl group or a $C_6$-$C_{15}$ aromatic group, and n represents an integer from 0 to 10.

3. The blue photosensitive resin composition for the color filter according to claim 1, wherein based on 100 parts by weight of the total used amount of the alkali-soluble resin (C), the used amount of the organic pigment (A) is from 30 parts by weight to 300 parts by weight; the used amount of the dye (B) is from 5 parts by weight to 50 parts by weight; the used amount of the cationic polymeric compound (D) is from 20 parts by weight to 200 parts by weight; the used amount of the cationic photoinitiator (E) is from 5 parts by weight to 50 parts by weight; and the organic solvent (F) is from 500 parts by weight to 5000 parts by weight.

4. The blue photosensitive resin composition for the color filter according to claim 1, wherein, the organic pigment (A) comprises a copper phthalocyanine-based blue organic pigment (A-1) and/or a violet organic pigment (A-2).

5. The blue photosensitive resin composition for the color filter according to claim 4, wherein based on 100 parts by weight of the total used amount of the alkali-soluble resin (C), the used amount of the copper phthalocyanine-based blue pigment (A-1) is from 20 parts by weight to 200 parts by weight; and/or the violet organic pigment (A-2) is from 10 parts by weight to 100 parts by weight.

6. The blue photosensitive resin composition for the color filter according to claim 1, wherein based on 100 parts by weight of the total used amount of the alkali-soluble resin (C), the used amount of the first alkali-soluble resin (C-1) is from 30 parts by weight to 100 parts by weight.

7. The blue photosensitive resin composition for the color filter according to claim 1, wherein the alkali-soluble resin (C) further comprises a second alkali-soluble resin (C-2), and the second alkali-soluble resin (C-2) is obtained by copolymerizing an ethylenically unsaturated monomer containing one or more carboxyl groups and other copolymerizable ethylenically unsaturated monomer.

8. The blue photosensitive resin composition for the color filter according to claim 7, wherein based on 100 parts by weight of the total used amount of the alkali-soluble resin (C), the used amount of the second alkali-soluble resin (C-2) is from 0 part by weight to 70 parts by weight.

9. The blue photosensitive resin composition for the color filter according to claim 1, wherein based on 100 parts by weight of the total used amount of the alkali-soluble resin (C), the used amount of the compound (D-1) containing the oxetane group is from 20 parts by weight to 200 parts by weight.

10. The blue photosensitive resin composition for the color filter according to claim 1, which further comprises a compound (G) containing an ethylenically unsaturated group.

11. The blue photosensitive resin composition for a color filter according to claim 10, wherein based on 100 parts by weight of the total used amount of the alkali-soluble resin (C), the used amount of the compound (G) containing the ethylenically unsaturated group is from 30 parts by weight to 300 parts by weight.

12. The blue photosensitive resin composition for the color filter according to claim 1, which further comprises a free-radical photoinitiator (H).

13. The blue photosensitive resin composition for the color filter according to claim 12, wherein based on 100 parts by weight of the total used amount of the alkali-soluble resin (C), the used amount of the free-radical photoinitiator (H) is from 10 parts by weight to 100 parts by weight.

14. A method for manufacturing a color filter comprising forming a pixel layer with the blue photosensitive resin composition for the color filter according to claim 1.

15. A color filter manufactured by the method according to claim 14.

16. A liquid crystal display device comprising the color filter according to claim 15.

17. The blue photosensitive resin composition for the color filter according to claim 1, wherein the cationic photoinitiator (E) is an onium salt of Formula (II):

$$[R^{51}_xR^{52}_yR^{53}_zR^{54}_uW]^{+p}A(-p) \qquad \text{Formula (II)},$$

wherein:

W represents an element constituting an onium cation;

$R^{51}$, $R^{52}$, $R^{53}$, and $R^{54}$ independently represents a monovalent organic group; or two or more than two of $R^{51}$, $R^{52}$, $R^{53}$, and $R^{54}$ form a ring with W, and others independently represent a monovalent organic group;

x, y, z and u independently represents an integer from 0 to 3 and (x+y+z+u) is equal to the valence of W;

A(-p) represents p valence of an onium anion; and p is equal to a charge number of the onium cation and onium anion.

* * * * *